(12) United States Patent
Harima et al.

(10) Patent No.: US 8,941,445 B2
(45) Date of Patent: Jan. 27, 2015

(54) PIEZOELECTRIC MODULE

(71) Applicant: Nihon Dempa Kogyo Co., Ltd., Tokyo (JP)

(72) Inventors: Hidenori Harima, Saitama (JP); Fumio Asamura, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 68 days.

(21) Appl. No.: 13/746,330

(22) Filed: Jan. 22, 2013

(65) Prior Publication Data

US 2013/0187723 A1    Jul. 25, 2013

(30) Foreign Application Priority Data

Jan. 23, 2012  (JP) ................................ 2012-011038
Mar. 14, 2012  (JP) ................................ 2012-057673
Oct. 9, 2012  (JP) ................................ 2012-224426

(51) Int. Cl.
| | |
|---|---|
| *H03B 5/32* | (2006.01) |
| *H03H 9/10* | (2006.01) |
| *H03H 9/17* | (2006.01) |
| *H03B 5/36* | (2006.01) |
| *H03H 9/05* | (2006.01) |

(Continued)

(52) U.S. Cl.
CPC . *H03B 5/36* (2013.01); *H03H 9/17* (2013.01); *H03H 9/0538* (2013.01); *H03H 9/0585* (2013.01); *H03H 9/0509* (2013.01);

(Continued)

(58) Field of Classification Search
CPC ............. G04F 5/04; G04F 5/06; G04F 5/063; H03B 5/30; H03B 5/32; H03B 5/323; H03B 5/326; H03B 5/36; H03B 2200/0016; H03B 2200/0018; H03B 2200/002; H03H 3/007; H03H 3/0072; H03H 3/0073; H03H 3/02; H03H 3/08; H03H 9/05; H03H 9/0514; H03H 9/0519; H03H 9/0523; H03H 9/0538; H03H 9/0547; H03H 9/0561; H03H 9/0585; H03H 9/10; H03H 9/1035; H03H 9/1042; H03H 9/105; H03H 9/1071; H03H 9/1092; H03H 9/15; H03H 9/17; H03L 1/028
USPC ......... 29/25.35; 310/311, 344, 348, 349, 368, 310/370; 331/154, 156, 158, 68
See application file for complete search history.

(56) References Cited

U.S. PATENT DOCUMENTS 4,783,888 A * 11/1988 Fujii et al. .................... 29/25.35
5,502,344 A * 3/1996 Yoshimoto et al. ........... 310/344

(Continued)

FOREIGN PATENT DOCUMENTS

| | | |
|---|---|---|
| JP | 2004-180012 | 6/2004 |
| JP | 2007-251766 | 9/2007 |
| JP | 2009-105628 | 5/2009 |

*Primary Examiner* — Levi Gannon
(74) *Attorney, Agent, or Firm* — Jianq Chyun IP Office

(57) ABSTRACT

A piezoelectric module includes a piezoelectric package and a circuit component package. The piezoelectric module includes a thermoset resin with solder particles interposed between a whole circumference of the opening end surface of the second depressed portion including the plurality of connecting terminals of the circuit component package and the outer bottom surface of the first depressed portion of the piezoelectric package. The plurality of external terminals of the piezoelectric package and the plurality of connecting terminals of the circuit component package are electrically connected by metal bonding. The whole circumference of the opening end surface of the second depressed portion of the circuit component package and the outer bottom surface of the first depressed portion of the piezoelectric package are bonded by melting and hardening of the thermoset resin that constitutes the thermoset resin with solder particles.

15 Claims, 18 Drawing Sheets

(52) U.S. Cl.
CPC .......... *H03H 9/0547* (2013.01); *H03H 9/1021* (2013.01); *H03H 9/1071* (2013.01)
USPC .............. 331/158; 331/68; 310/348; 310/368

(56) References Cited

U.S. PATENT DOCUMENTS

| | | | | |
|---|---|---|---|---|
| 5,684,677 A | * | 11/1997 | Uchida et al. | 361/770 |
| 6,005,330 A | * | 12/1999 | Okeshi et al. | 310/348 |
| 7,486,149 B2 | * | 2/2009 | Harima | 331/68 |
| 7,551,040 B2 | * | 6/2009 | Harima | 331/68 |
| 8,557,630 B2 | * | 10/2013 | Sakemi | 438/106 |
| 8,710,931 B2 | * | 4/2014 | Harima | 331/68 |
| 2010/0103224 A1 | * | 4/2010 | Gerner et al. | 347/68 |
| 2011/0249417 A1 | * | 10/2011 | Kawabata | 361/760 |
| 2013/0257549 A1 | * | 10/2013 | Asamura | 331/68 |

* cited by examiner

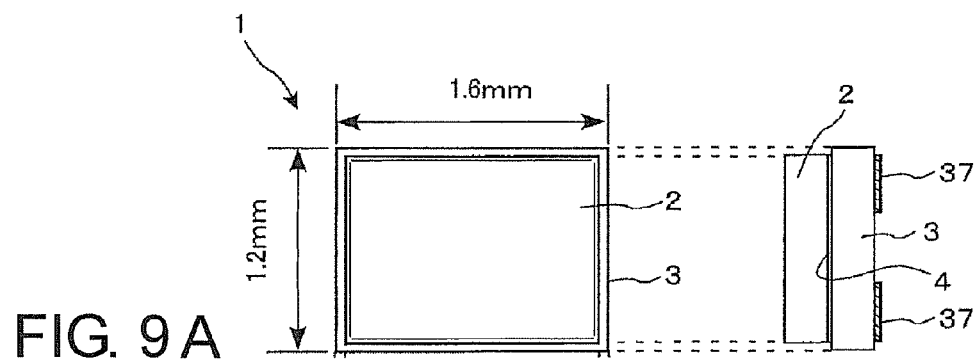
FIG. 9A  FIG. 9C  FIG. 9B
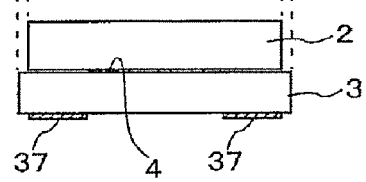
FIG. 10
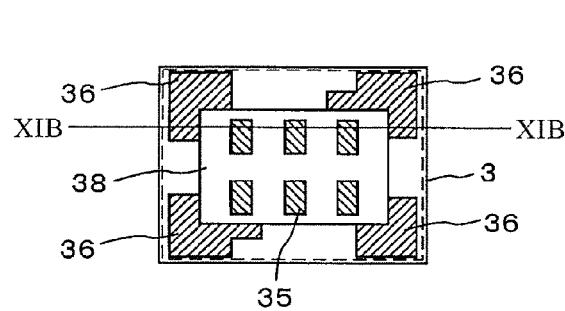 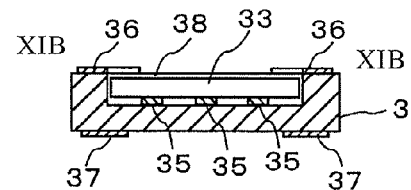
FIG. 11A  FIG. 11B

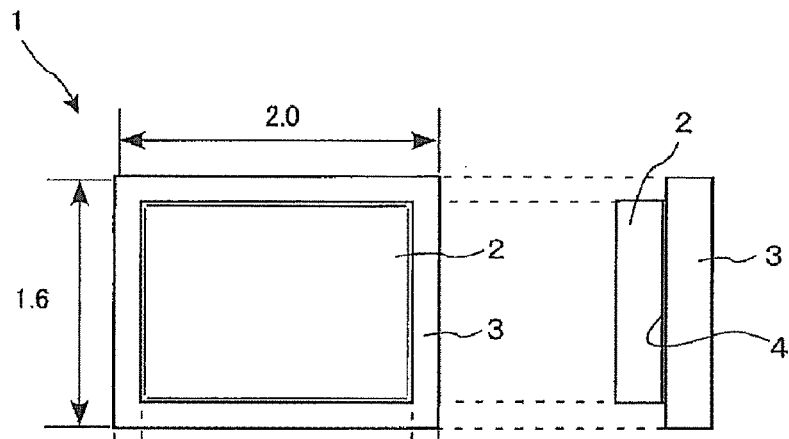
FIG. 12A
FIG. 12C
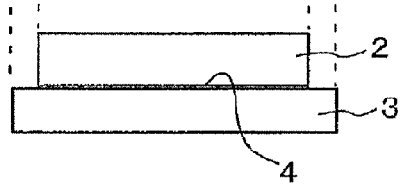
FIG. 12B
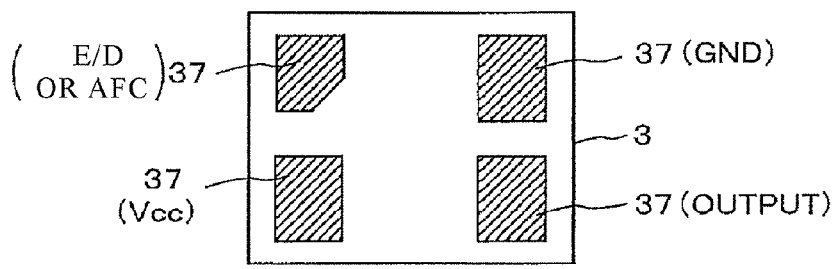
FIG. 13
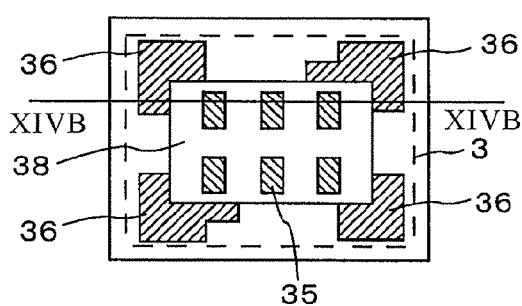
FIG. 14A
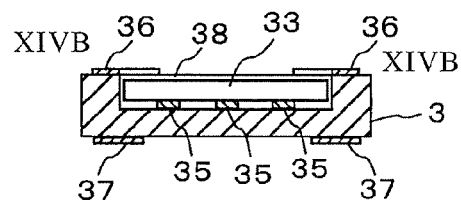
FIG. 14B

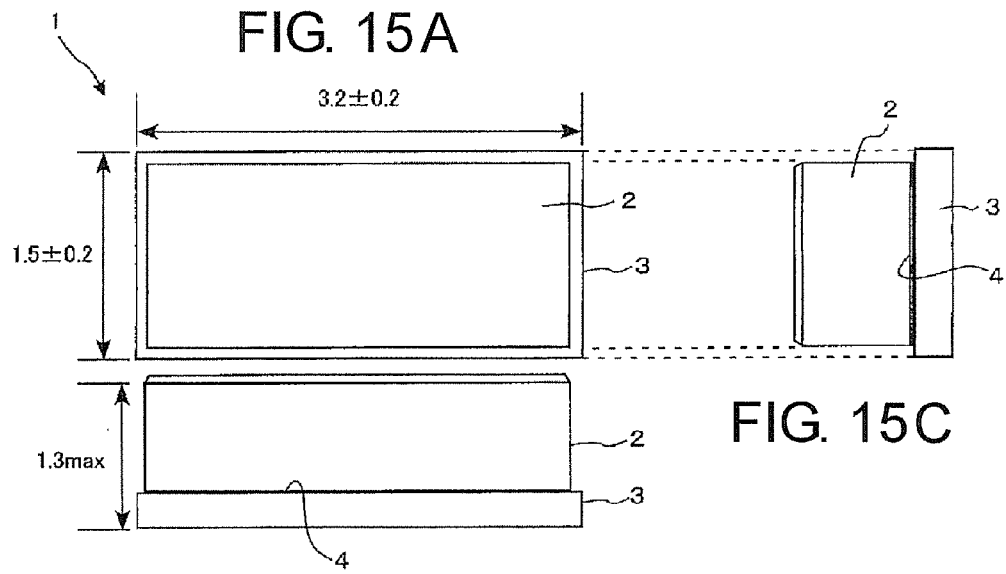
FIG. 15A
FIG. 15B
FIG. 15C
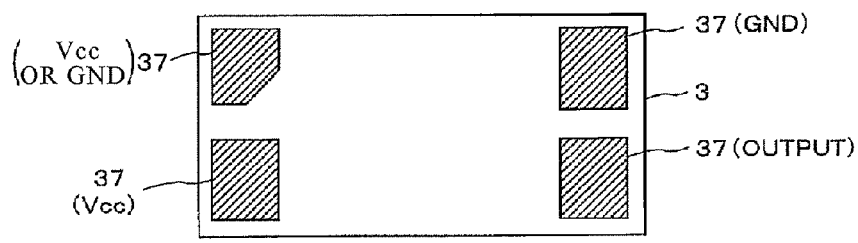
FIG. 16
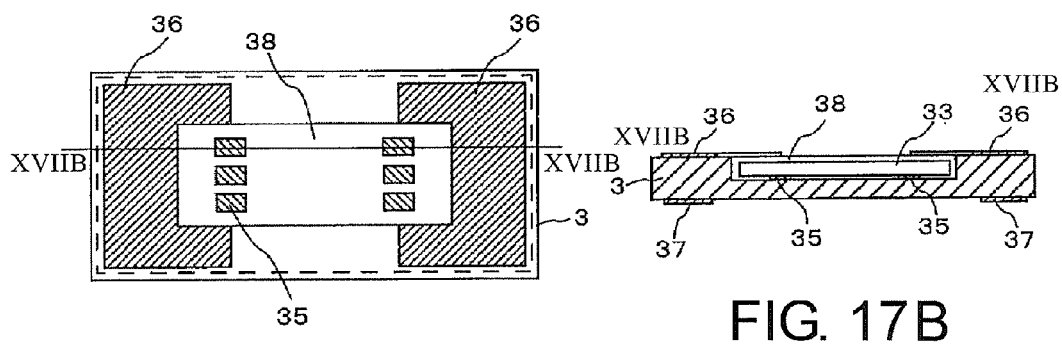
FIG. 17A
FIG. 17B

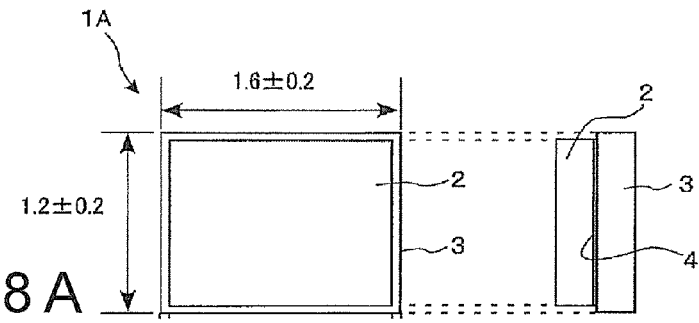
FIG. 18A    FIG. 18C
FIG. 18B
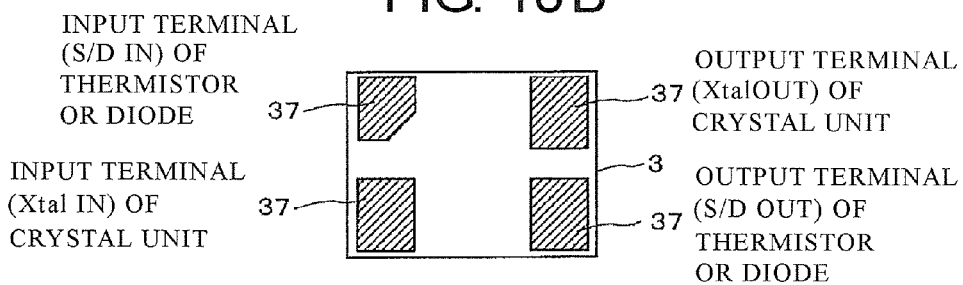
FIG. 19
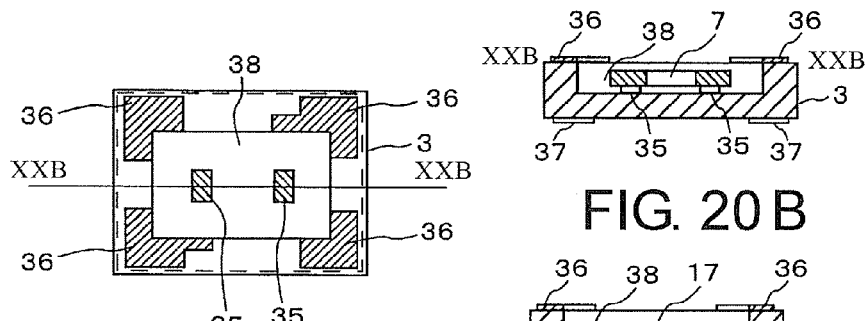
FIG. 20A    FIG. 20B
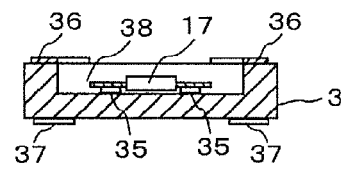
FIG. 20C

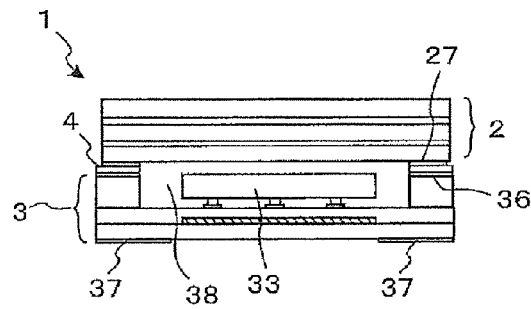
FIG. 21
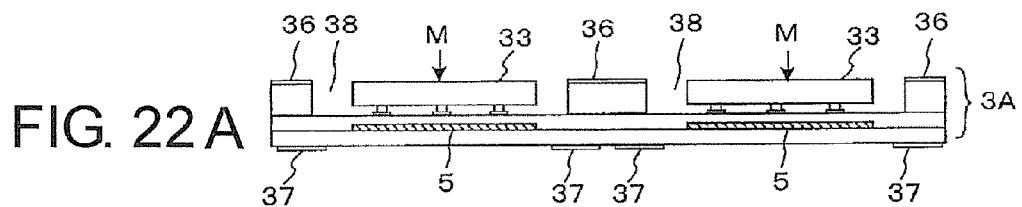
FIG. 22A
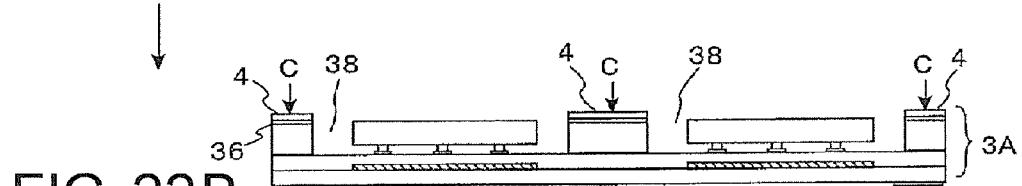
FIG. 22B
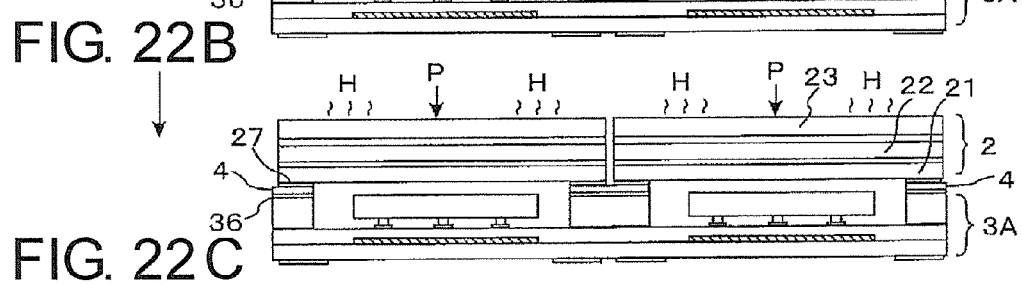
FIG. 22C
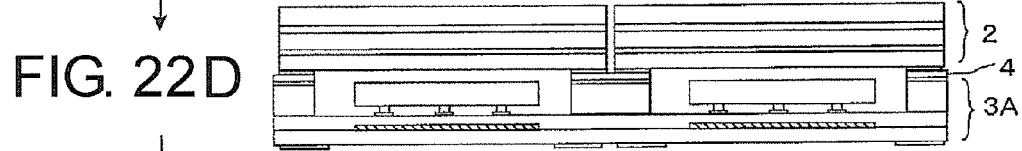
FIG. 22D
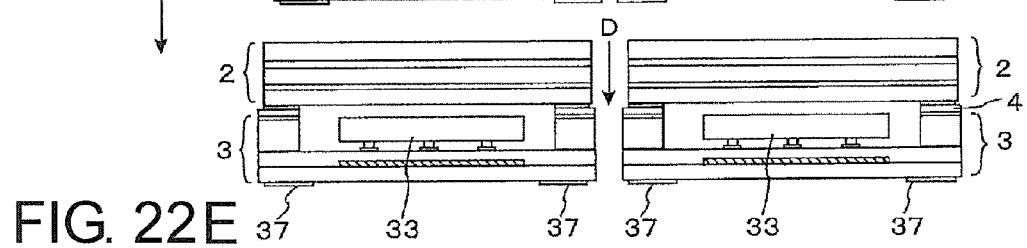
FIG. 22E

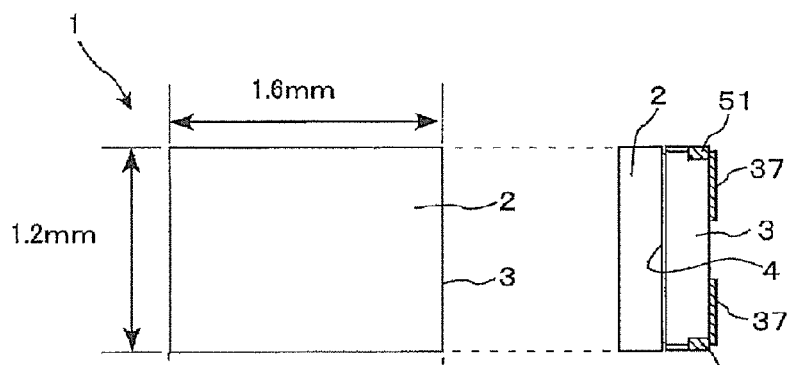
FIG. 23 A
FIG. 23 C
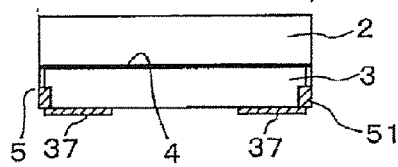
FIG. 23 B
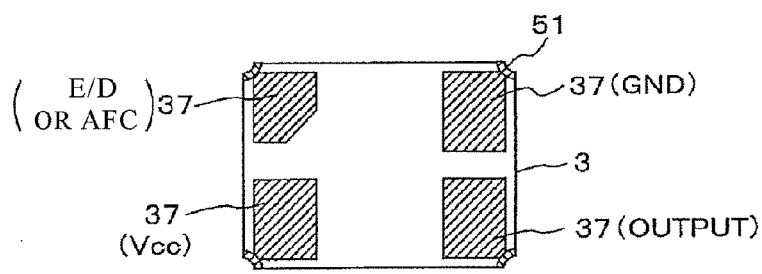
FIG. 24
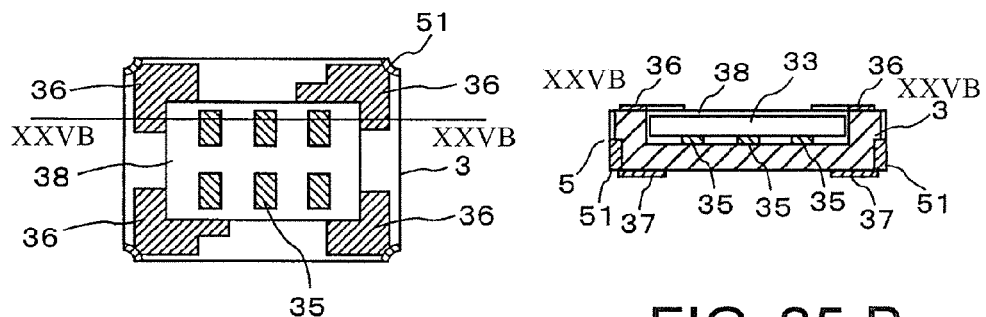
FIG. 25 A
FIG. 25 B

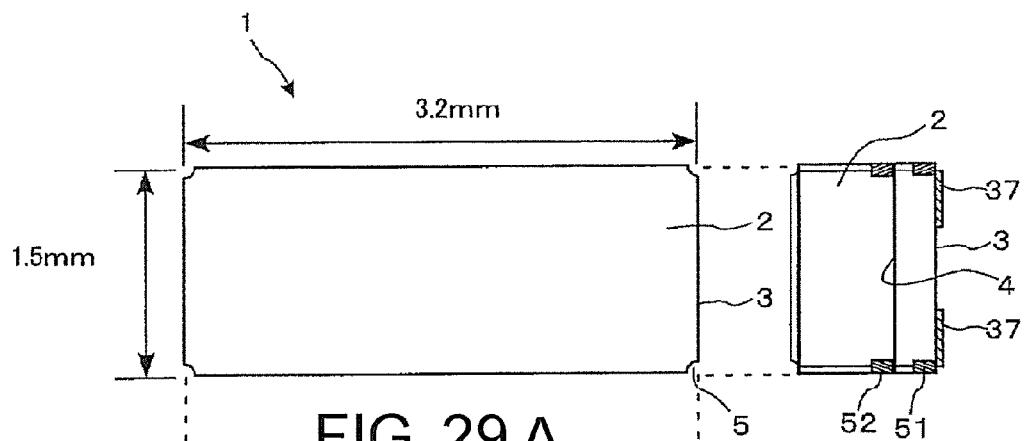
FIG. 29 A
FIG. 29 C
FIG. 29 B
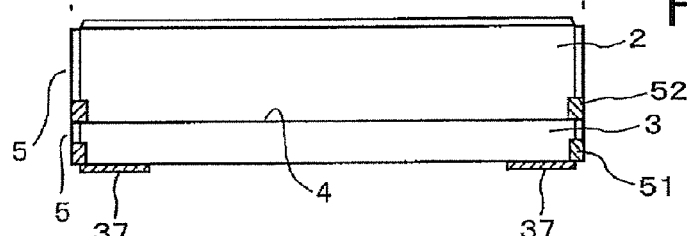
FIG. 30
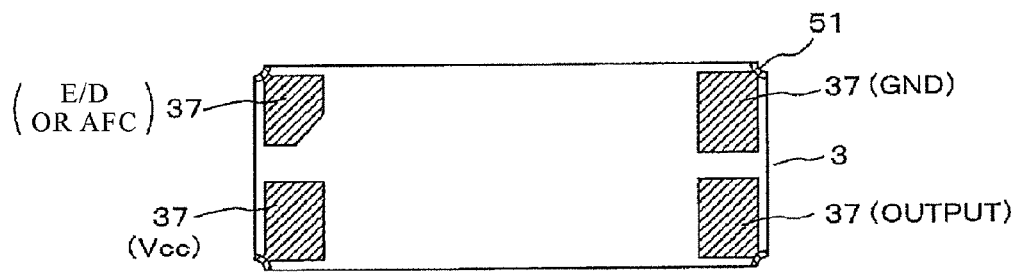
FIG. 31 A
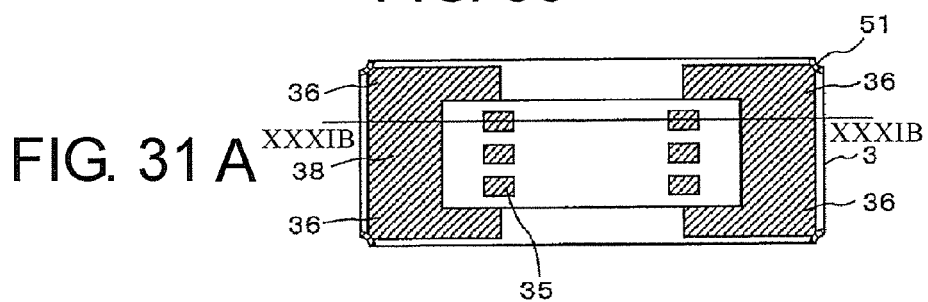
FIG. 31 B
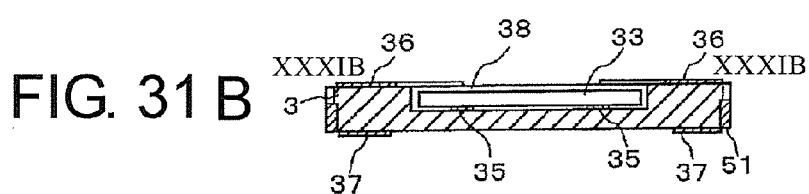

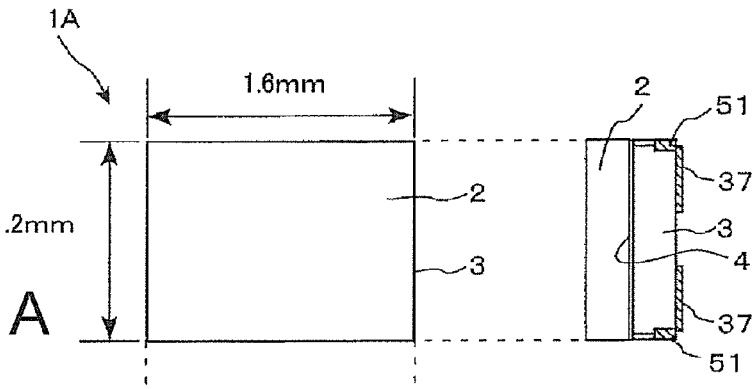
FIG. 32 A
FIG. 32 C
FIG. 32 B
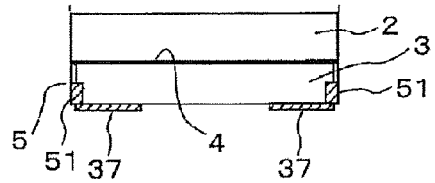
FIG. 33
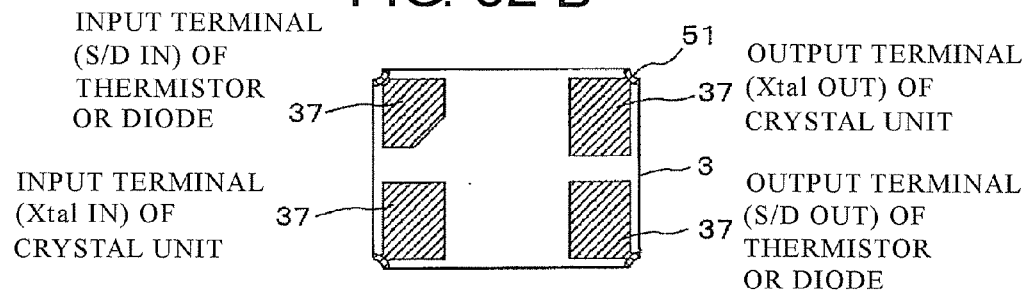
FIG. 34 A
FIG. 34 B
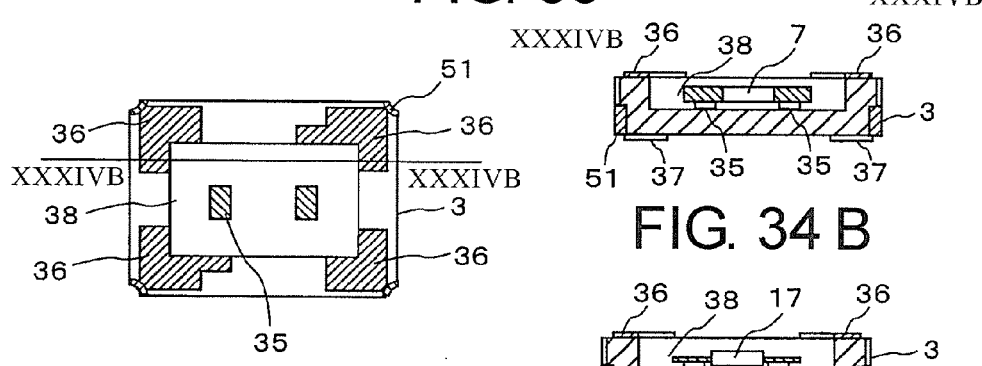
FIG. 34 C

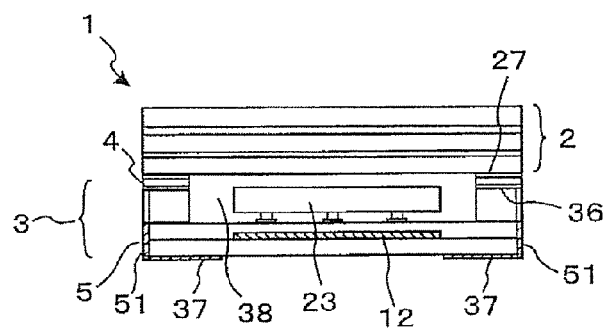
FIG. 35
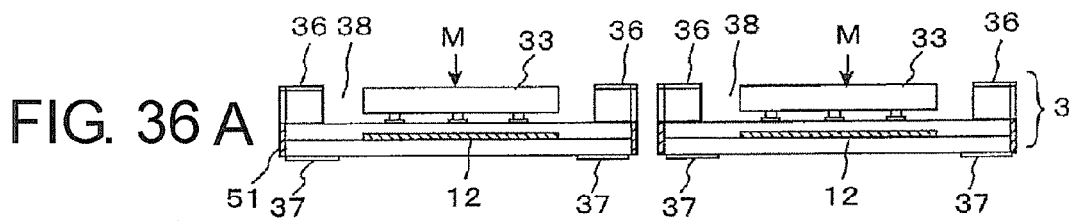
FIG. 36A
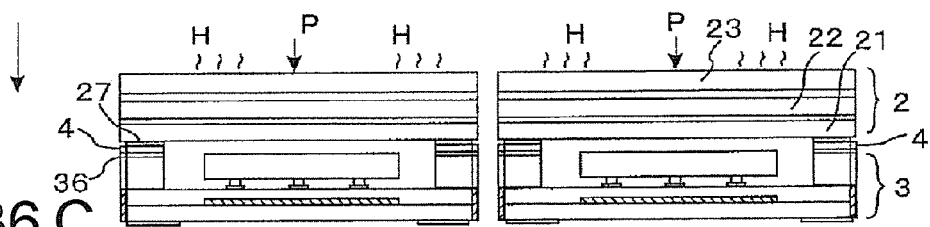
FIG. 36B
FIG. 36C
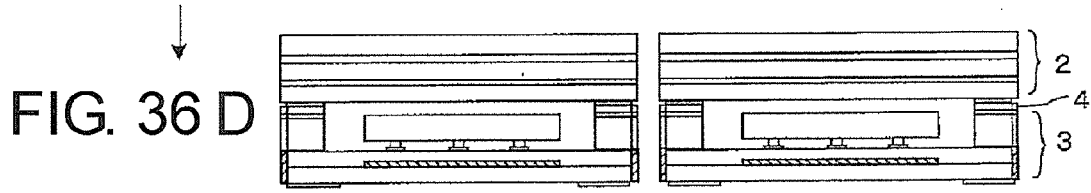
FIG. 36D

PIEZOELECTRIC MODULE

CROSS-REFERENCE TO RELATED APPLICATIONS

This application claims the priority benefit of Japan Patent Application No. 2012-011038, filed on Jan. 23, 2012, Japan Patent Application No. 2012-057673, filed on Mar. 14, 2012, and Japan Patent Application No. 2012-224426, filed on Oct. 9, 2012. The entirety of each of the above-mentioned patent applications is hereby incorporated by reference herein and made a part of this specification.

TECHNICAL FIELD

This disclosure relates to a piezoelectric module where a piezoelectric package and a circuit component package are integrally bonded together. The piezoelectric package houses a piezoelectric resonator including a piezoelectric member such as a crystal. The circuit component package includes an IC chip that integrates a circuit constituting an oscillator together with the piezoelectric resonator, or a part of a circuit element constituting an oscillator. Especially, this disclosure relates to a piezoelectric module for surface mount that ensures a bonding strength of the both packages, guarantees high reliability by securely sealing the packages as a device structure, and achieves a low-profile, downsized, and low-price device.

DESCRIPTION OF THE RELATED ART

A circuit component package constitutes a piezoelectric module together with a piezoelectric resonator. The circuit component package includes an oscillator circuit, an IC chip which integrates an oscillator circuit having a temperature control function, or a part of a discrete component that constitutes an oscillator circuit. A piezoelectric module where a circuit component package with an IC chip integrating an oscillator circuit is bonded to a piezoelectric package makes an oscillator alone that outputs a predetermined frequency. A piezoelectric module where a circuit component package, which includes a part of a discrete component constituting an oscillator circuit, is bonded to a piezoelectric package makes an oscillator that outputs a predetermined frequency together with a circuit prepared in an applied electronic equipment side.

A piezoelectric module typified by a surface mount crystal controlled oscillator is small in size and lightweight. For example, a temperature compensation type piezoelectric module has a high frequency stability with respect to a change in external air temperature. Thus, the piezoelectric module is embedded especially in portable electronic equipment (such as a mobile phone) as a frequency reference source or a time reference source. A description will be given of a crystal controlled oscillator, which is a typical device of a piezoelectric oscillator, where an oscillator circuit (an IC chip) is mounted to a circuit component package. Note that, there is a so-called simple package type crystal controlled oscillator where a circuit component package includes an IC chip without a temperature compensation mechanism. One of a piezoelectric module with a temperature compensation mechanism (for example, a crystal controlled oscillator) includes a piezoelectric package (which is referred to as a crystal package in the case where a crystal piece is used) that houses a crystal unit including a piezoelectric piece (for example, crystal piece) and a circuit component package with an IC chip (an IC chip package in this case). The piezoelectric package is bonded to the circuit component package in a two-level structure in the vertical direction.

Instead of a structure where a circuit component package with an IC chip is stacked and fixedly secured to the above-described piezoelectric package, a structure of a piezoelectric module with temperature sensor, which houses a thermistor or a diode, is similarly applicable.

Here, a description will be given of a piezoelectric resonator as a crystal unit and a piezoelectric module with a crystal unit as a crystal controlled oscillator, also in embodiments. However, this disclosure is not limited to these piezoelectric modules. The disclosure is similarly applicable to a piezoelectric related device such as a SAW (surface acoustic wave) filter, various electronic devices including a connection structure that integrates a mounting board with a circuit component package and a circuit component inside or outside of the components.

An exemplary crystal controlled oscillator described here is not limited to various pieces of electronic equipment including portable equipment, but can also be embedded into vehicle electronic equipment or similar equipment. There has been a need to consider strong connection structure to prevent solder crack and damage on a board or a main body of a component in electronic equipment, such as vehicle electronic equipment where impacts occur and the environment temperature changes considerably. The solder crack or the damage is caused by a difference in thermal expansion due to secular change or heat cycle, or stress variation such as board warpage due to an external force. As described above, this type of oscillator requires both a low-profile feature and toughness.

FIGS. 37A and 37B are schematic views illustrating one exemplary configuration of the crystal controlled oscillator, which is a typical device of a piezoelectric module. FIG. 37A illustrates a cross-sectional view. FIG. 37B illustrates a plan view when an opening end surface of an IC chip package constituting the crystal controlled oscillator is viewed from a crystal package side. As illustrated, a crystal controlled oscillator 1 includes a crystal package 2 and an IC chip package 3. The crystal package 2 houses a crystal unit 24 in an approximately rectangular in planar view. The IC chip package 3 is a circuit component package and has approximately the same shape as the crystal package 2 in planar view and includes an IC chip 33. The IC chip 33 integrates an electronic circuit constituting a crystal controlled oscillator together with the crystal unit 24. The crystal package 2 includes a container main body made of a ceramics sheet (which is also referred to as a green sheet) or a similar material. The container main body is formed by a bottom wall layer (hereinafter referred to as a first bottom wall layer 21) of the crystal package 2 and a frame wall layer (hereinafter referred to as a first frame wall layer 22) of the crystal package 2. The crystal unit 24 is mounted and housed in a depressed portion (a depressed portion of a crystal package, hereinafter referred to as a first depressed portion 28) surrounded by the first frame wall layer 22 of a container main body 20. The container main body 20 has an approximately the same rectangular shape as the crystal package 2 in planar view facing the crystal package 2. Usually, the crystal package 2 and the IC chip package 3 share an outer side surface in a state where the crystal package 2 and the IC chip package 3 are stacked in the vertical direction and are bonded as the crystal controlled oscillator 1.

The crystal unit 24 includes excitation electrodes (not shown) on both surfaces of a thin piece (crystal piece) of crystal. Extraction electrodes (similarly, not shown) extending from the respective excitation electrodes to one end edge of the crystal piece are fixedly secured to a pair of crystal holding terminals 26 (only one side is illustrated) with a conductive adhesive 25. The pair of crystal holding terminals 26 is disposed on an inner bottom surface (one principal surface) of the first depressed portion 28.

The first depressed portion 28 housing the crystal unit 24 is hermetically sealed by a lid body 23 formed of a metal plate, thus forming the crystal package 2. The lid body 23 and the first frame wall layer 22 are sealed by seam welding or similar method via a metal film (or a metal ring, not shown) that employs the same type of material as that of the lid body 23. Some lid bodies 23 employ a non-metal material such as a crystal plate, a ceramic substrate, and a hard resin plate. The first bottom wall layer 21 has an outer bottom surface (the other principal surface) on which external terminals 27 are disposed. The external terminal 27 is disposed for connecting a connecting terminal 36 of the IC chip package 3 with an IC chip 33 via a solder layer 6. The external terminal 27 is electrically connected to the crystal holding terminal 26 through a through-hole or a via hole 30 that passes through the first bottom wall layer 21.

The IC chip package 3 with the IC chip 33 employs a laminated substrate formed of a bottom wall layer (hereinafter referred to as a second bottom wall layer 31) of the IC chip package 3, and a frame wall layer (hereinafter referred to as a second frame wall layer 32) of the IC chip package 3 made of a ceramics sheet. The IC chip package 3 may employ a multilayer in the second bottom wall layer and the second frame wall layer. The IC chip package 3 includes one principal surface (an IC chip mounting surface), which is an inner bottom surface of a depressed portion 38 (hereinafter referred to as a second depressed portion) of the IC chip package 3 surrounded by the second frame wall layer 32 of the IC chip package 3. A wiring pattern and a plurality of electrode pads 35 are formed on the one principal surface. The second frame wall layer 32 includes A connecting terminal 36 is formed on the opening end surface of the second frame wall layer 32. The connecting terminal 36 is to be connected to an external terminal 27 of the crystal package 2. The IC chip package 3 has the other principal surface (the outer bottom surface of the second bottom wall layer 31, equipment mounting surface) on which a plurality of mounting terminals 37 (four in this example) is disposed for surface mounting a circuit board of an applied electronic equipment.

The IC chip 33 is fixedly secured to the electrode pad 35 on one principal surface (an inner bottom surface) of the second frame wall layer 32 via mounting bump 34 (such as a solder bump or gold bump) of the IC chip 33 by an ultrasonic thermo-compression bonding method or similar method. Further, a resin layer, which is preferably an epoxy resin, referred to as an underfill (not shown) is filled between the IC chip 33 and the one principal surface of the IC chip package 3, thus ensuring strength as a device. The mounting of the IC chip is not limited to a connection using a bump and an electrode pad. A wire may also be employed.

The IC chip package 3 with the IC chip 33 and the crystal package 2 are generally bonded together as follows. A solder material is disposed between the connecting terminal 36, which is formed on an opening end surface (a surface facing the outer bottom surface of the crystal package 2) of the second frame wall layer 32 of the IC chip package 3, and the external terminal 27 of the crystal package 2. The solder material is melted by a reflow process and then hardens, thus a solder layer 6 is formed and the both packages are bonded together. The solder layer 6 is formed only on the top surface of the connecting terminal 36 made of a metal material. The solder layer 6 may be disposed on the external terminal 27 of the crystal package 2 for the reflow process. Then, an epoxy resin or similar is filled in the depressed portion between the other principal surface (the outer bottom surface) of the crystal package 2 and the IC chip 33, and between the one principal surface of the second frame wall layer 32 and the IC chip 33 as an underfill layer (not shown). This can improve a device strength. Japanese Unexamined Patent Application Publications No. 2004-180012 and No. 2007-251766 disclose the related art of this type of oscillator.

The crystal controlled oscillator of this type includes a crystal package and an IC chip package that are stacked in two levels and bonded together. In this type of the crystal controlled oscillator, the external terminal 27 disposed on the outer bottom surface (the outer bottom surface of the first bottom wall layer 21 in FIG. 37A) of the crystal package is aligned with the connecting terminal 36 disposed in a part corresponding to an opening end surface (an opening end surface of the second depressed portion 38 in FIG. 37A) of the depressed portion of the IC chip package. Both of the external terminal 27 and the connecting terminal 36 are electrically and mechanically connected with a solder for bonding each other.

Recently, an IC chip has been downsized along with downsizing of a crystal controlled oscillator. An IC chip package with the IC chip is also requested to be downsized. In view of this, downsizing of the IC chip package is necessary. Accordingly, an area of an opening of a depressed portion, which is mounted with the IC chip, becomes small, thus limiting the size of an IC chip to be mounted. Especially, in a case of a high performance crystal controlled oscillator that requires an IC chip with a temperature control mechanism, the size of a mountable IC chip is limited.

A crystal controlled oscillator for mobile communication equipment or vehicle equipment requires an underfill filling process after an IC chip is mounted on the bottom surface of a depressed portion. The underfill filling process strongly secures the IC chip and improves a vibration resistance, an impact resistance, and a dust resistance. However, the depressed portion of the IC chip package is extremely small, the depressed portion space after the IC chip is mounted becomes narrower, and a space formed between the IC chip and the bottom surface of the depressed portion or the inner wall surface of the depressed portion is further narrow. It is extremely difficult to fill a correct amount of resin into such small space.

With a piezoelectric module such as the crystal controlled oscillator 1, where the IC chip package 3 with the IC chip 33 is bonded to the crystal package 2 with the solder layer 6 or similar, it is important that a sufficient bonding strength is ensured between the external terminal 27 of the crystal package 2 and the connecting terminal 36 of the IC chip package 3, which is a circuit component package. It is also important that the depressed portion that houses the IC chip is sealed to prevent intrusion of humidity and dust. A depressed portion is not formed on the outer bottom surface (the other principal surface) of the first bottom wall layer 21, which constitutes the container main body 20 of the crystal package 2. This ensures the large area of the external terminal 27. However, the connecting terminal 36 of the IC chip package 3 is disposed on the opening end surface of the second frame wall layer 32. To ensure a bonding strength with the external terminal 27 of the crystal package 2, the opening end surface on which the connecting terminal 36 is formed requires a certain large area.

If the opening end surface of the second frame wall layer 32 becomes large, the planar view area of the second depressed portion 38 becomes relatively narrow. As a result, the size of the IC chip 33 mounted on the second depressed portion 38 is limited by the size of the second depressed portion 38. The following configuration may be considered. The width in planar view of the opening end surface where the connecting terminal 36 is to be formed is formed narrow, the connecting terminal 36 is formed to be long and narrow along the opening end surface side, and the external terminal 27 of the crystal package 2 also has a shape corresponding to such connecting terminal 36. In this case, a space between the external terminals (between the connecting terminals) become narrow, and short-circuit may occur.

A need thus exists for a piezoelectric module which is not susceptible to the drawback mentioned above.

SUMMARY

According to an aspect of this disclosure, there is provided a piezoelectric module. The piezoelectric module includes a piezoelectric package and a circuit component package. The piezoelectric package houses a piezoelectric resonator. The circuit component package houses a circuit component configured to generate an oscillation signal at a predetermined frequency based on a vibration signal of the piezoelectric resonator. The piezoelectric package and the circuit component package are electrically and mechanically bonded. The piezoelectric package includes a first depressed portion, a lid body, and a plurality of external terminals. The first depressed portion is formed by a first bottom wall layer and a first frame wall layer. The first depressed portion houses the piezoelectric resonator. The lid body seals the first depressed portion. The plurality of external terminals is configured to output the vibration signal of the piezoelectric resonator to an outer bottom surface of the first depressed portion. The circuit component package includes a second depressed portion and a plurality of connecting terminals. The second depressed portion is formed by a second bottom wall layer and a second frame wall layer. The second depressed portion houses the circuit component. The plurality of connecting terminals is disposed on an opening end surface of the second depressed portion. The plurality of connecting terminals is electrically connected to the plurality of respective external terminals on the outer bottom surface of the piezoelectric package. The piezoelectric module includes a thermoset resin with solder particles interposed between a whole circumference of the opening end surface of the second depressed portion and the outer bottom surface of the first depressed portion of the piezoelectric package, and the second depressed portion includes the plurality of connecting terminals of the circuit component package. The plurality of external terminals of the piezoelectric package and the plurality of connecting terminals of the circuit component package are electrically connected by a metal bonding. The metal bonding employs melting and hardening of solder particles that constitute the thermoset resin with solder particles. The whole circumference of the opening end surface of the second depressed portion of the circuit component package and the outer bottom surface of the first depressed portion of the piezoelectric package are bonded by melting and hardening of the thermoset resin that constitutes the thermoset resin with solder particles.

BRIEF DESCRIPTION OF THE DRAWINGS

The foregoing and additional features and characteristics of this disclosure will become more apparent from the following detailed description considered with the reference to the accompanying drawings, wherein:

FIGS. 9A to 9C are external views illustrating Embodiment 9 where a piezoelectric module according to this disclosure is applied to a crystal controlled oscillator;

FIG. 10 is a plan view illustrating the bottom surface of the crystal controlled oscillator illustrated in FIGS. 9A to 9C;

FIGS. 11A and 11B are explanatory views of the IC chip housing portion of the IC chip package of the crystal controlled oscillator illustrated in FIGS. 9A to 9C;

FIGS. 12A to 12C are external views of a crystal controlled oscillator illustrating Embodiment 10 where a piezoelectric module according to this disclosure is applied to a crystal controlled oscillator;

FIG. 13 is a plan view illustrating the bottom surface of the crystal controlled oscillator illustrated in FIGS. 12A to 12C;

FIGS. 14A and 14B are explanatory views of the IC chip housing portion of the IC chip package of the crystal controlled oscillator illustrated in FIGS. 12A to 12C;

FIGS. 15A to 15C are external views of a crystal controlled oscillator illustrating Embodiment 11 where a piezoelectric module according to this disclosure is applied to a crystal controlled oscillator;

FIG. 16 is a plan view illustrating the bottom surface of the crystal controlled oscillator illustrated in FIGS. 15A to 15C;

FIGS. 17A and 17B are explanatory views of the IC chip housing portion of the IC chip package of the crystal controlled oscillator 1 illustrated in FIGS. 15A to 15C;

FIGS. 18A to 18C are external views of a crystal unit with temperature sensor illustrating Embodiment 12 where a piezoelectric module according to this disclosure is applied to a crystal controlled oscillator;

FIG. 19 is a plan view illustrating the bottom surface (the outer surface, the mounting surface of an applied equipment) of the crystal unit with temperature sensor 1A in FIGS. 18A to 18C;

FIGS. 20A to 20C are explanatory views illustrating a mounting portion of a thermistor or a diode of the IC chip package of the crystal unit with temperature sensor 1A in FIGS. 18A to 18C;

FIG. 21 is a cross-sectional view of the main part of the crystal controlled oscillator, which is a target of one exemplary fabrication method of this disclosure, illustrated in FIGS. 9A to 9C as Embodiment 13;

FIGS. 22A to 22E are fabrication process views of the main part of the crystal controlled oscillator illustrating one exemplary fabrication method of the crystal controlled oscillator illustrated in FIGS. 9A to 9C according to this disclosure;

FIGS. 23A to 23C are external views illustrating Embodiment 14 where a piezoelectric module according to this disclosure is applied to a crystal controlled oscillator;

FIG. 24 is a plan view illustrating the bottom surface of the crystal controlled oscillator illustrated in FIGS. 23A to 23C;

FIGS. 25A and 25B are explanatory views of the IC chip housing portion of the IC chip package of the crystal controlled oscillator illustrated in FIGS. 23A to 23C;

FIGS. 29A to 29C are external views of a crystal controlled oscillator illustrating Embodiment 16 where a piezoelectric module according to this disclosure is applied to a crystal controlled oscillator;

FIG. 30 is a plan view illustrating the bottom surface of the crystal controlled oscillator illustrated in FIGS. 29A to 29C;

FIGS. 31A and 31B are explanatory views of the IC chip housing portion of the IC chip package of the crystal controlled oscillator 1 illustrated in FIGS. 29A to 29C;

FIGS. 32A to 32C are external views of a crystal unit with temperature sensor illustrating Embodiment 17 where a piezoelectric module according to this disclosure is applied to a crystal controlled oscillator;

FIG. 33 is a plan view illustrating the bottom surface of the crystal unit with temperature sensor 1A illustrated in FIGS. 32A to 32C;

FIGS. 34A to 34C are explanatory views of the housing portion of a thermistor or a diode of the circuit component package of the crystal unit with temperature sensor 1A illustrated in FIGS. 32A to 32C;

FIG. 35 is a cross-sectional view of the main part of the crystal controlled oscillator, which is a target of one exemplary fabrication method of this disclosure, illustrated in FIGS. 23A to 23C as Embodiment 18;

FIGS. 36A to 36D are fabrication process views of the main part illustrating one exemplary fabrication method of the crystal controlled oscillator illustrated in FIGS. 23A to 23C according to this disclosure.

DETAILED DESCRIPTION

The preferred embodiments of a piezoelectric module according to this disclosure will be described in detail with referring to embodiments where the piezoelectric module is applied to a crystal controlled oscillator or a crystal unit with temperature sensor.

Embodiment 1

Figure 1A:
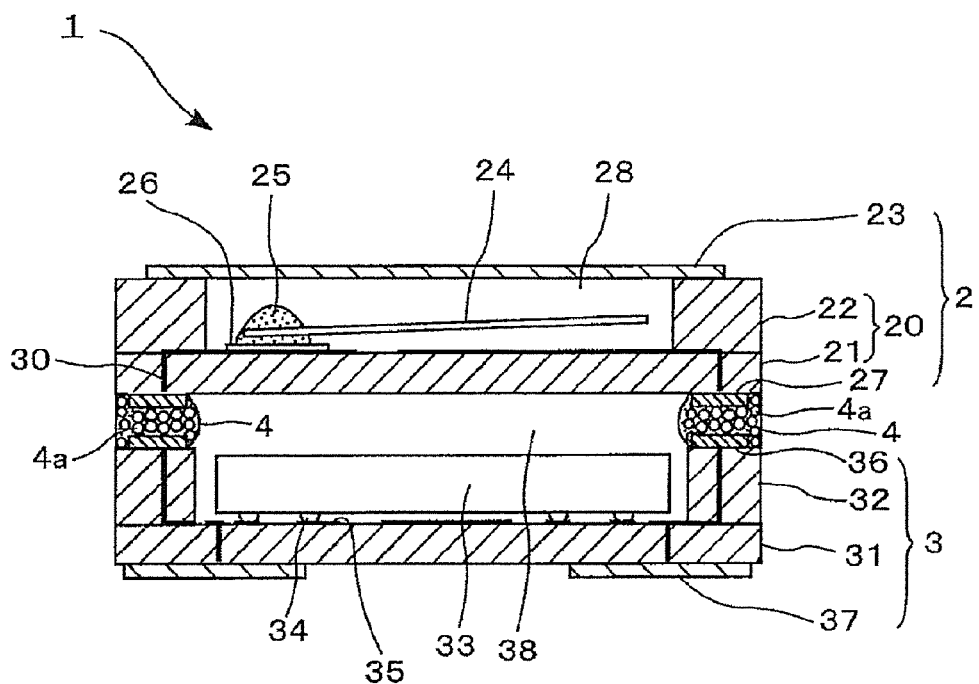
FIGS. 1A and 1B are schematic views illustrating Embodiment 1 where a piezoelectric module according to this disclosure is applied to a crystal controlled oscillator.
Figure 1B:
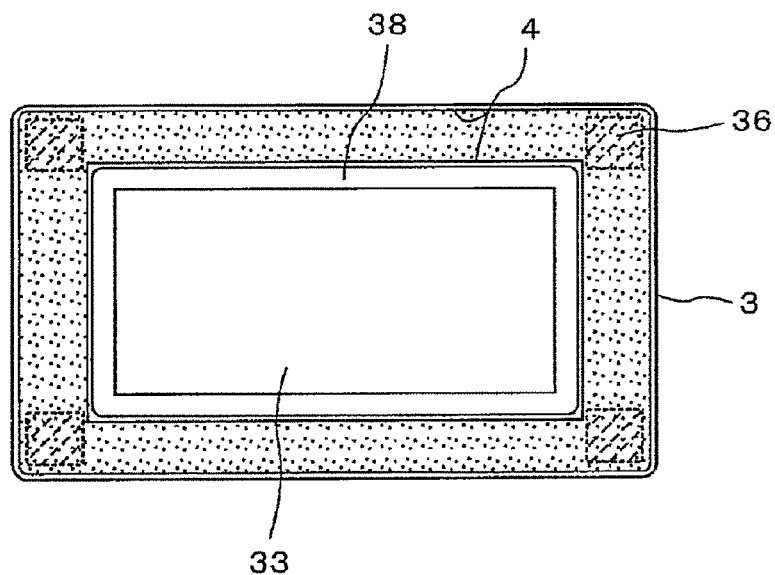

FIGS. 1A and 1B are explanatory views illustrating Embodiment 1 where a piezoelectric module according to this disclosure is applied to a crystal controlled oscillator.

FIG. 1A illustrates a cross-sectional view. FIG. 1B is a plan view illustrating a depressed portion in an IC chip package of FIG. 1A viewed from a crystal package side. A crystal controlled oscillator 1 according to Embodiment 1 includes a crystal package 2 and an IC chip package 3. The crystal package 2 includes a crystal unit 24 and has a rectangular shape in planar view. The IC chip package 3 is a circuit component package that houses an IC chip 33. The IC chip 33 integrates an electronic circuit to constitute a crystal controlled oscillator together with the crystal package 2.

Figure 37:
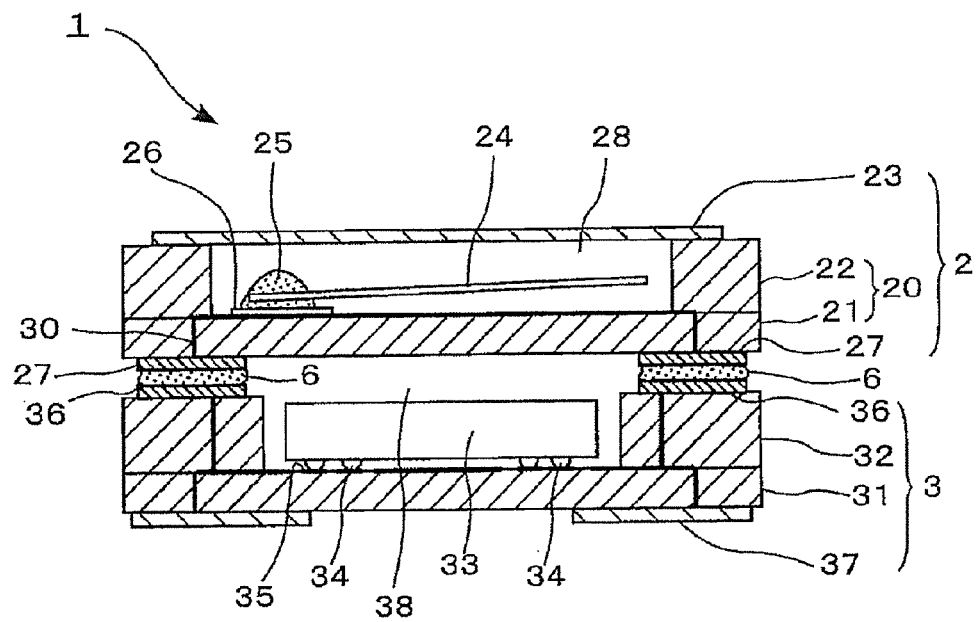
FIGS. 37A and 37B are schematic views illustrating one exemplary configuration of the conventional crystal controlled oscillator, which is a typical device of a piezoelectric module.
Figure 37:
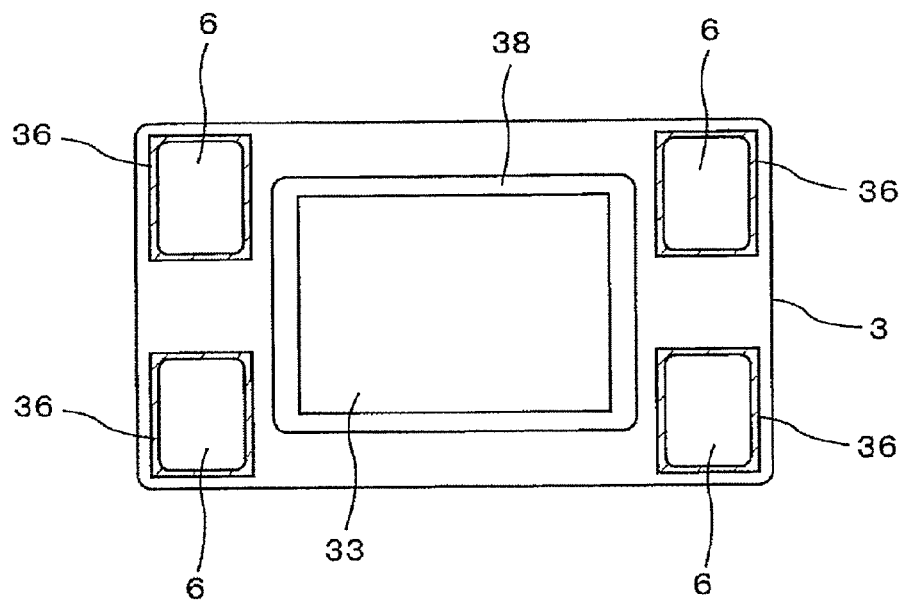

Similar to the crystal controlled oscillator illustrated in FIG. 37A, the crystal package 2 includes a bottom wall layer (a first bottom wall layer 21) and a frame wall layer (a first frame wall layer 22) of a crystal unit, which are preferably a ceramics sheet. The crystal unit 24 is housed in a depressed portion (a depressed portion of the crystal package, a first depressed portion 28) surrounded by the first frame wall layer 22. The first frame wall layer 22 constitutes a container main body 20 that has a rectangular shape in planar view. Generally, the crystal package 2 and the IC chip package 3 are stacked in two levels in the vertical direction and bonded as the crystal controlled oscillator 1. Thus, the crystal package 2 and the IC chip package 3 are integrated in a form of a flat box.

The crystal unit 24 includes a pair of excitation electrodes (not shown) on both surfaces of a crystal thin piece (a crystal piece). The pair of excitation electrodes sandwiches the crystal piece. Extraction electrodes (not shown) extend from this pair of respective excitation electrodes to one end edge of the crystal piece. The extraction electrodes are fixedly secured to a pair of crystal holding terminals 26 (only one side is shown.) with a conductive adhesive 25. The pair of crystal holding terminals 26 is disposed on an inner bottom surface (one principal surface) of the first depressed portion 28.

The first depressed portion 28, which houses the crystal unit 24, is hermetically sealed using a lid body 23 to make the crystal package 2. The lid body 23 is formed using a metal plate, which is preferably a kovar. A metal film of the same kind as the lid body is employed to seal the lid body 23 and the first frame wall layer 22 by seam welding or similar method. The lid body 23 can employ a non-metal material such as a crystal plate, a ceramics substrate, and a hard resin plate as well as a metal plate and sealed with an appropriate adhesive. In that case, it is preferable to dispose a metal film on any surface of the lid body 23. An external terminal 27 is disposed on the outer bottom surface (the other principal surface) of the first bottom wall layer 21. The external terminal 27 connects to a connecting terminal 36 of the IC chip package 3, which houses an IC chip 33, via a thermoset resin 4 with solder particles. The external terminal 27 is electrically connected to the crystal holding terminal 26 through a through-hole or a via hole 30 that passes through the first bottom wall layer 21.

The IC chip package 3, which houses the IC chip 33, has a structure approximately similar to the structure illustrated in FIGS. 37A and 37B. The IC chip package 3 includes a laminated substrate formed of a bottom wall layer 31 (a second bottom wall layer) and a frame wall layer 32 (a second frame wall layer) made of a ceramics sheet. A multilayer sheet can form one side or the other side of the second bottom wall layer and the second frame wall layer, which constitute the IC chip package 3. In that case, it is preferable that a metal film or a metal plate is disposed on an inner layer or an outer surface of the multilayer sheet to provide shielding.

A wiring pattern and a plurality of electrode pads 35 are formed on one principal surface (an IC chip mounting surface) of the IC chip package 3. The one principal surface is an inner bottom surface of a depressed portion 38 (a second depressed portion) of the IC chip package surrounded by the second frame wall layer 32 of the IC chip package 3. The connecting terminal 36, which connects to the external terminal 27 of the crystal package 2, is formed at an opening end surface of the second frame wall layer 32. A plurality of mounting terminals 37 (four in this example) is disposed on the other principal surface (the outer bottom surface of the second bottom wall layer 31, equipment mounting surface) of the IC chip package 3. The plurality of mounting terminals 37 is to be surface-mounted on a circuit board of an applied electronic equipment.

According to this embodiment, the width (the width when viewed in a bottom wall layer direction) of the second frame wall layer 32, which constitutes the IC chip package 3, is small (narrow). Further, the area of the depressed portion 38 (the size in planar view) is larger than that of the related art illustrated in FIGS. 37A and 37B, and is larger than the area of the first depressed portion 28. This allows housing an IC chip with a larger size inside of the second depressed portion 38 without enlarging the external size (the external size of the crystal unit remains the same).

The IC chip 33 is fixedly secured to an electrode pad 35 via mounting bump 34 (such as a solder bump or gold bump) of the IC chip 33 by an ultrasonic thermo-compression bonding method or similar method, and the electrode pad 35 is formed on one principal surface (an inner bottom surface) of the second frame wall layer 32.

A second container is formed by the second bottom wall layer 31 and the second frame wall layer 32 constituting the IC chip package 3. The second container includes a connecting terminal 36 disposed on the opening end surface (the surface of the second frame wall layer 32 facing the external terminal 27 of the crystal package 2) of the second depressed portion 38. The connecting terminal 36 faces and electrically connects to the external terminal 27 of the crystal package 2. The connecting terminal 36 connects to a predetermined circuit terminal of the IC chip 33 through a through-hole or a via hole, which is appropriately disposed in the second container, and a wiring (not shown), which is patterned on the inner bottom surface of the second bottom wall layer 31 of the second depressed portion 38. The second bottom wall layer 31 includes the outer bottom surface on which a plurality of mounting terminals 37 is disposed for surface mounting a circuit board or similar of the mounting target equipment. An operating power source is supplied from these mounting terminals 37, and an oscillation signal of a predetermined frequency is supplied to a required functional circuit of the mounting board.

The crystal package 2 connects to the IC chip package 3 by heating and pressurizing a thermoset resin 4 with solder particles that is interposed between the formation surface of the external terminal 27 (the outer bottom surface of the crystal package 2) and the formation surface of the connecting terminal 36 (the opening end surface of the depressed portion). The thermoset resin 4 with solder particles, where tiny solder particles 4a are dispersed in the thermoset resin 4, is applied by surrounding around the whole surface including the connecting terminal 36 on the opening end surface of the depressed portion of the IC chip package 3. This application may employ direct writing using dispenser, screen-printing, an application method using an ink jet nozzle, or a method of attaching a film-shaped resin.

By heating and pressurizing the applied thermoset resin 4 with solder particles, the above-described external terminal 27 and the connecting terminal 36 are electrically connected together. This allows sealing the crystal package 2 and the IC chip package 3, and mechanically and fixedly securing them strongly. The thermoset resin 4 with solder particles may be applied on the outer bottom surface side of the crystal package 2, or may be applied both on the opening end surface of the depressed portion of the IC chip package 3 and the outer bottom surface of the crystal package 2 to stack the packages and then heated and pressurized.

This structure according to Embodiment 1 allows the small opening end surface of the depressed portion of the IC chip package for electrically connecting to the external terminal of the crystal package. This allows the enlarged area of the second depressed portion without enlarging its external size, thus allowing housing an IC chip with a large size. Especially in a case of a high-performance crystal controlled oscillator such as a Temperature compensated crystal controlled oscillator (TCXO), a large-scale circuit is integrated into the IC chip, compared with a circuit of a usual crystal controlled oscillator. Therefore, a high performance and large-scale IC chip can be housed without enlarging the external size of the IC chip package.

In the case where an IC chip in the same size as the conventional IC chip is used, the external sizes of the IC chip package is downsized. This leads to downsizing of the external size of the whole crystal controlled oscillator along with downsizing of the external size of the crystal package.

A direct application of a thermoset resin with solder particles on a terminal surface allows eliminating a solder precoating process. The solder precoating process is performed on the electrode surfaces of the terminals when connecting the external terminal of the crystal package and the connecting terminal of the IC chip package together by solder bonding. In addition, an electrical connection between the external terminal of the crystal package and the connecting terminal of the IC chip package, and hermetic sealing between the crystal package and the IC chip package are performed at the same time. This ensures a dramatically simplified fabrication process of a crystal controlled oscillator.

Embodiment 2

Figure 2:
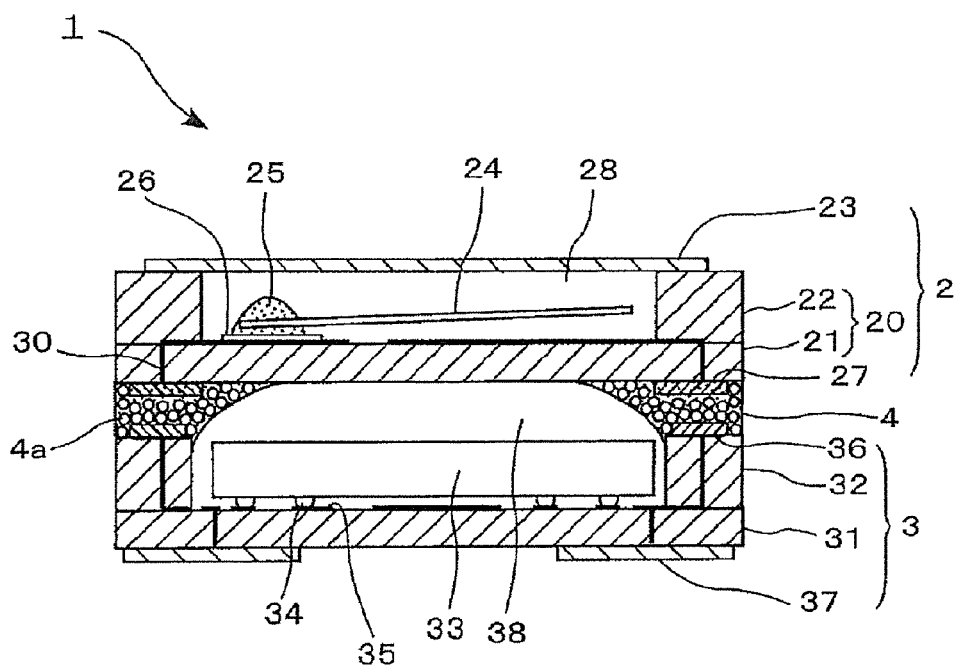
FIG. 2 is a cross-sectional view illustrating Embodiment 2 where a piezoelectric module according to this disclosure is applied to a crystal controlled oscillator.

FIG. 2 is a cross-sectional view illustrating Embodiment 2 where a piezoelectric module according to this disclosure is applied to a crystal controlled oscillator, similarly to FIG. 1A. The general constitution of a crystal package 2 and an IC chip package 3 according to Embodiment 2 is approximately similar to Embodiment 1. Unless otherwise required, the duplicative explanation is eliminated. This embodiment mainly differs from the above-described Embodiment in a periphery of a bonding structure of the crystal package 2 and the IC chip package 3.

A connecting terminal 36 of the IC chip package 3 needs only to have a function that can receive a voltage signal from a crystal unit 24 of the crystal package 2. Insofar as an electrical connection between the both terminals is ensured, the electrode area of the connecting terminal 36 needs not to be especially large. This is true of an external terminal 27 of the crystal package 2.

The crystal package 2 includes a first bottom wall layer 21 on which the external terminal 27 is disposed. The first bottom wall layer 21 is made of a ceramics sheet and generally has flat surfaces across the whole surface. The first bottom wall layer 21 has a sufficient area to form a terminal, compared with the opening end surface of the depressed portion of the IC chip package 3. The external terminal 27 of the crystal package 2 may have a large electrode area (generally, a square or a rectangular shape close to a square). The external terminal 27 of the crystal package 2 are spaced at the maximum distance such that short-circuit does not occur each other. On the other hand, the connecting terminal 36 of the IC chip package 3 is to receive an output voltage from the crystal unit 24 of the crystal package 2. The connecting terminal 36 may only need a size enough to electrically connect the external terminal 27 of the crystal package 2 and may be smaller than the external terminal 27. Further, the connecting terminal 36 may not necessary to be a square and a rectangular. The connecting terminal 36 may have a shape other than a square or a rectangular, for example, a line shape, a spiral shape, a circular shape, and an irregular shape. This is true of each embodiment that will be described below.

According to Embodiment 2, the connecting terminal 36 on the opening end surface of the depressed portion of the IC chip package 3 has a width narrower than that of the external terminal 27 of the crystal package 2, as illustrated in the cross-sectional view of FIG. 2. That is, the connecting terminal 36 is shifted toward the inside of both end edges of the opening end surface of the depressed portion. The external terminal 27 of the crystal package 2 faces the connecting terminal 36 and includes a portion that extends to the inside of the outer bottom surface of the crystal package 2. According to Embodiment 2, a slightly excessed amount of a thermoset resin 4 with solder particles is applied on the opening end surface of the depressed portion of the IC chip package 3. It is apparent that the thermoset resin 4 with solder particles may be applied along the external terminal 27 of the crystal package 2.

The both packages, where the thermoset resin 4 with solder particles is applied, are heated and pressurized. Then, solder particles 4a dispersed in the thermoset resin 4 with solder particles, which is disposed between the connecting terminal 36 of the opening end surface of the depressed portion of the IC chip package 3 and the external terminal 27 of the crystal package 2, are engaged between the connecting terminal 36 and the external terminal 27, thus performing metal bonding. At the same time, an excess of the melted thermoset resin 4 with solder particles is excluded from between electrode surfaces on the both terminals and flows and wets the electrode surfaces on the both terminals. A part of the excess of the thermoset resin 4 with solder particles hardens. This consequently connects the outer bottom surface of the crystal package 2 and the inner wall of a second frame wall layer 32, which forms the opening end surface of the depressed portion of the IC chip package 3.

The thermoset resin 4 with solder particles melts and hardens on the whole circumference portion other than a region where the external terminal 27 of the crystal package 2 faces the connecting terminal 36 of the IC chip package 3. Thus, the outer bottom surface of the crystal package 2 and the opening end surface of the depressed portion of the IC chip package 3 are sealed and bonded.

Thus, even if the connecting terminal of the IC chip package is relatively smaller than the external terminal of the crystal package, connection of them by metal bonding using the thermoset resin with solder particles ensures supply of a vibration signal voltage of the crystal unit to an oscillator circuit including an IC chip. Alternatively, the thermoset resin with solder particles is applied over the whole circumference of the bonding portion of the crystal package and the IC chip package. Then, the external terminal of the crystal package and the connecting terminal of the IC chip package are heated and pressurized to perform metal bonding. At the same time, the both packages are strongly bonded by hardening of the thermoset resin with solder particles.

This embodiment also allows the crystal package and the IC chip package to be sealed and bonded with the thermoset resin with solder particles. This prevents adhesion of a foreign matter to the IC chip and eliminates the need for a filling an underfill material to fixedly secure the IC chip.

Embodiment 3

Figure 3:
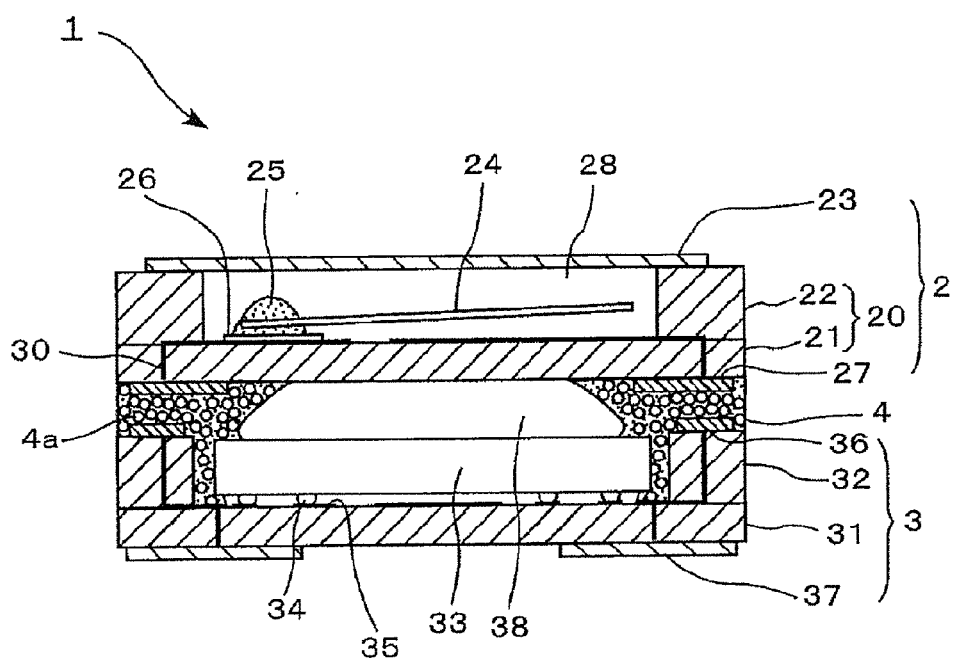
FIG. 3 is a cross-sectional view illustrating Embodiment 3 where a piezoelectric module according to this disclosure is applied to a crystal controlled oscillator.

FIG. 3 is a cross-sectional view illustrating Embodiment 3 where a piezoelectric module according to this disclosure is applied to a crystal controlled oscillator, similarly to FIG. 2. The constitution of a crystal package 2 and an IC chip package 3 in FIG. 3 is approximately similar to Embodiment 2. Unless otherwise required, the duplicative explanation is eliminated. This embodiment mainly differs from the above-described embodiments in a periphery of a bonding structure of the crystal package 2 and the IC chip package 3.

Embodiment 3 includes an external terminal 27 and a connecting terminal 36 similar to those described in Embodiment 2. A thermoset resin 4 with solder particles is employed to electrically and mechanically bond the crystal package 2 and the IC chip package 3. The thermoset resin 4 with solder particles is applied to a part of a gap at the periphery of the IC chip 33, which is housed in a second depressed portion 38, including the opening end surface of the second depressed portion 38 of the IC chip package 3 and a gap at the inner bottom of the second depressed portion 38. The thermoset resin 4 with solder particles is applied by the amount for filling in between these areas and the IC chip 33.

As described above, the crystal package 2 is positioned to the IC chip package 3 on which the thermoset resin 4 with solder particles is applied in a predetermined state similarly to each of the above-described embodiments. The both are heated and pressurized. Then, the solder particles 4a, which are disposed between the connecting terminal 36 on the opening end surface of the depressed portion of the IC chip package 3 and the external terminal 27 of the crystal package 2, connect the connecting terminal 36 and the external terminal 27 together by metal bonding. At the same time, the thermoset resin 4 with solder particles 4a melted by heating flows on and wets electrode surfaces of the both terminals. The excess of the thermoset resin 4 with solder particles fills in between the electrode surfaces of the both terminals to an inner wall of a second frame wall layer 32, which forms the outer bottom surface of the crystal package 2 and the opening end surface of the depressed portion of the IC chip package 3. A part of the resin flows into between an IC chip 33 and the inner lower surface of the second depressed portion 38 and then hardens.

Thus, the thermoset resin 4 with solder particles melts and hardens on the whole circumference portion other than a region where the external terminal 27 of the crystal package 2 faces the connecting terminal 36 of the IC chip package 3. The outer bottom surface of the crystal package 2 and the opening end surface of the depressed portion of the IC chip package 3 are sealed and bonded.

Even if the connecting terminal 36 of the IC chip package 3 is extremely smaller than the external terminal 27 of the crystal package 2, insofar as metal bonding with solder particles is performed between the both terminals, a vibration signal voltage of a crystal unit 24 is surely supplied to an oscillator circuit including the IC chip 33. Further, the thermoset resin 4 with solder particles 4a flows into the whole circumference of the bonding portion of the crystal package 2 and the IC chip package 3 and flows into a part of the second depressed portion 38, and the thermoset resin 4 with solder particles 4a hardens. Then, the external terminal 27 of the crystal package 2 and the connecting terminal 36 of the IC chip package 3 are heated and pressurized to perform metal bonding and electrical connection. At the same time, the both packages are strongly and integrally bonded without a gap.

This embodiment also allows strongly bonding a crystal package and an IC chip package with a thermoset resin with solder particles without a gap. This prevents intrusion and adhesion of a foreign matter to an IC chip, eliminates the need for filling an underfill material to fixedly secure the IC chip, and simplifies a fabrication process of a crystal controlled oscillator.

Embodiment 4

Figure 4:
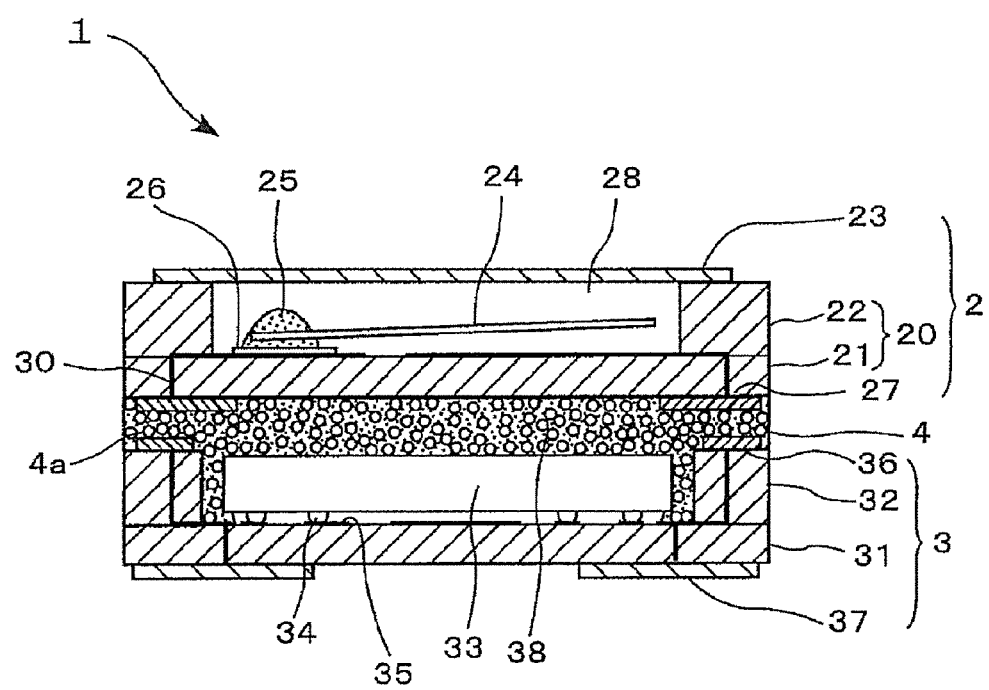
FIG. 4 is a cross-sectional view illustrating Embodiment 4 where a piezoelectric module according to this disclosure is applied to a crystal controlled oscillator.

FIG. 4 is a cross-sectional view illustrating Embodiment 4 where a piezoelectric module according to this disclosure is applied to a crystal controlled oscillator, similarly to FIG. 3. The constitution of a crystal package 2 and an IC chip package 3 in FIG. 4 is approximately similar to Embodiment 3. Unless otherwise required, the duplicative explanation is eliminated. This embodiment mainly differs from the above-described embodiments in a periphery of a bonding structure of the crystal package 2 and the IC chip package 3.

Embodiment 4 includes an external terminal 27 and a connecting terminal 36 similar to those described in Embodiment 3. A thermoset resin 4 with solder particles 4a, which electrically and mechanically bonds the crystal package 2 and the IC chip package 3 together, is applied such that the thermoset resin 4 with solder particles 4a fills in the whole IC chip housed in a second depressed portion 38, which includes the opening end surface of the depressed portion of the IC chip package 3.

After application of the thermoset resin 4 with solder particles 4a, the crystal package 2 is positioned to the IC chip package 3 in a predetermined state. The both are heated and pressurized. Then, the solder particles 4a, which are disposed between the connecting terminal 36 on the opening end surface of the depressed portion of the IC chip package 3 and the external terminal 27 of the crystal package 2, bonds the connecting terminal 36 and the external terminal 27 by metal bonding. At the same time, the thermoset resin 4 with solder particles 4a melted by heating fills in between the crystal package 2 and the IC chip package 3 and then hardens.

The thermoset resin 4 with solder particles 4a melts and hardens on the whole circumference portion other than a region where the external terminal 27 of the crystal package 2 faces the connecting terminal 36 of the IC chip package 3. Thus, the outer bottom surface of the crystal package 2 and the opening end surface of the depressed portion of the IC chip package 3 are sealed and bonded together.

In this embodiment, even if the connecting terminal 36 of the IC chip package 3 is extremely smaller than the external terminal 27 of the crystal package 2, insofar as metal bonding with solder particles is performed between the both terminals, a vibration signal voltage of a crystal unit 24 is surely supplied to an oscillator circuit including an IC chip 33. Further, the thermoset resin 4 with solder particles 4a fills in the second depressed portion 38 and then hardens. Then, the external terminal of the crystal package and the connecting terminal of the IC chip package are heated and pressurized to perform metal bonding and electrical connection. At the same time, the both are strongly and integrally bonded without a gap.

This embodiment also allows sealing and strongly bonding a crystal package and an IC chip package with a thermoset resin with solder particles. This prevents intrusion and adhesion of a foreign matter to an IC chip, eliminates the need for filling an underfill material to fixedly secure the IC chip, and simplifies a fabrication process of a crystal controlled oscillator.

In the above-described embodiments, a plurality of ceramics sheet is laminated as a substrate that constitutes the container main body of the crystal package and the IC chip package. This disclosure should not be construed in a limiting sense. An insulating material such as another similar sheet-shaped substrate material, a crystal plate, and a glass plate may be employed. Further, both or either of the IC chip package and the crystal package may be formed as a single sheet. An electromagnetic shielding effect may be achieved by providing a conductive material such as a metal film to an appropriate part of the container main body of the crystal package or a board, which constitutes the IC chip package, and connecting the conductive material to the ground.

The above-described explanation assumes a method where a plurality of devices is formed on large-size ceramics sheets that become base materials for both of the crystal package and the IC chip package, the crystal package side and the IC chip package side are bonded together and then individually separated. Accordingly, in each embodiment, bonding portions of individual outer side surfaces become linear as illustrated.

Embodiment 5

Figure 5A:
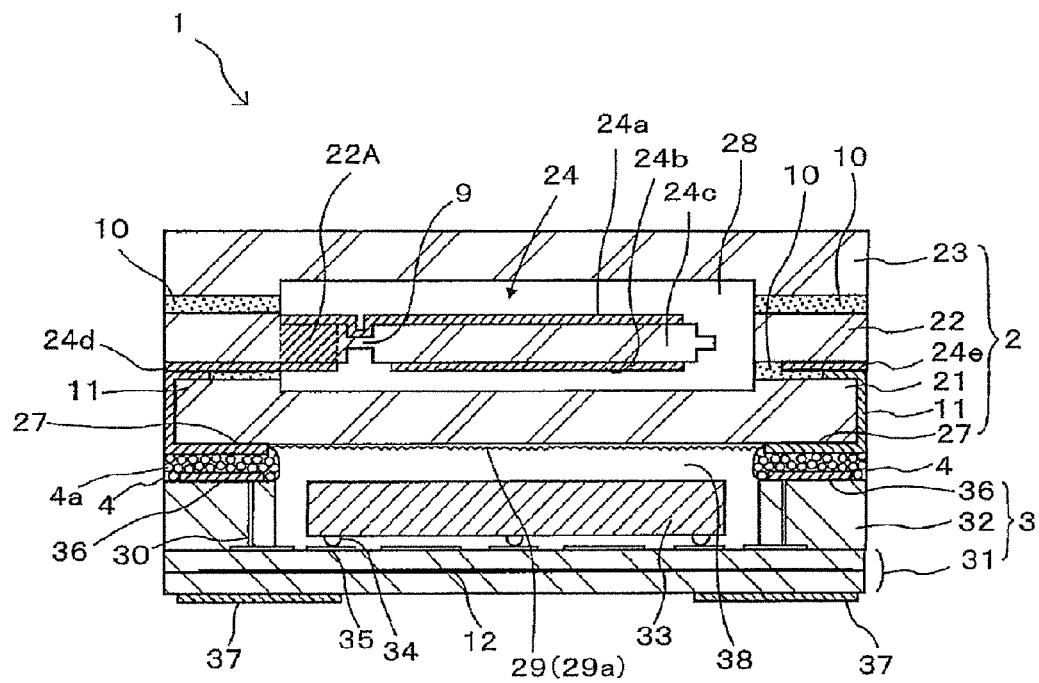
FIGS. 5A and 5B are schematic views illustrating Embodiment 5 where a piezoelectric module according to this disclosure is applied to a crystal controlled oscillator.
Figure 5B:
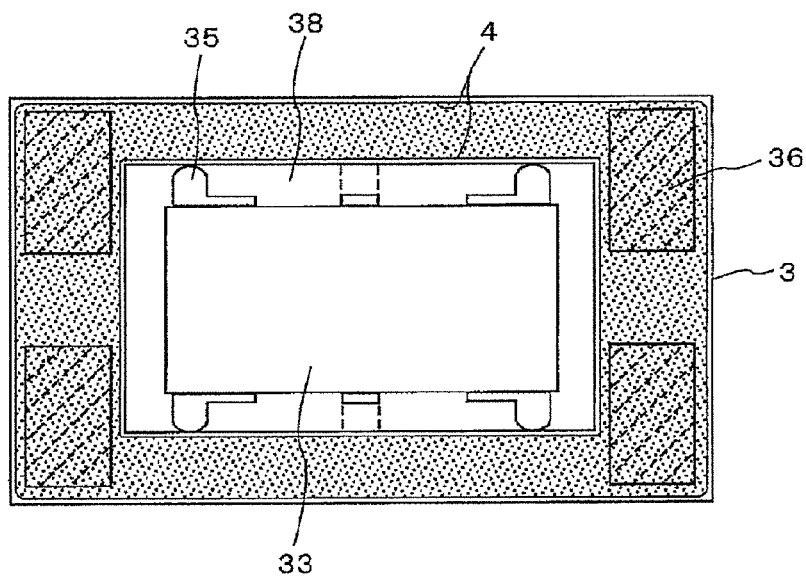

FIGS. 5A and 5B are explanatory views illustrating Embodiment 5 where a piezoelectric module according to this disclosure is applied to a crystal controlled oscillator. FIG. 5A illustrates a cross-sectional view. FIG. 5B illustrates a plan view when the IC chip package of FIG. 5A is viewed from a crystal package side. A crystal controlled oscillator 1 according to Embodiment 5 includes a crystal package 2 and an IC chip package 3, which is an IC chip substrate. The crystal package 2 according to Embodiment 5 includes a crystal piece 24c made of a crystal plate formed by an etching process, a top side excitation electrode 24a, a bottom side excitation electrode 24b, and extraction electrodes 24d and 24e that receive a vibration signal from these electrodes.

The crystal package 2 includes a frame wall layer 22 (a first frame wall layer) with a framing portion 22A on which the crystal piece 24c is supported with a connecting portion 9 from the inside of the framing portion 22A. The framing portion 22A is made of a crystal plate with a rectangular shape in planar view. The first frame wall layer 22 is sandwiched by a bottom wall layer 21 (a first bottom wall layer) and a lid body 23, which are similarly made of a crystal plate. This structure forms a space 28 (a first depressed portion) that houses a crystal unit 24. The first frame wall layer 22, the first bottom wall layer 21, and the lid body 23 are sealed with a sealing material 10 (for example, a low-melting-point glass) and fixedly secured.

Surface treatment is performed on an outer bottom surface 29, which faces the IC chip package 3, of the first bottom wall layer 21 of the container main body of the crystal package 2. This surface treatment forms a large number of minute unevenness or a large number of micropores 29a. The surface treatment is performed on the whole region of the outer bottom surface 29 or a surrounding portion that faces the opening end surface of the IC chip package 3.

In the case where the IC chip package 3 is bonded to the crystal package 2 with a thermoset resin with solder particles, a melted resin gets through the minute unevenness 29a formed on the outer bottom surface 29 of the crystal package other than a region of an external terminal formation portion on the outer bottom surface 29 and then hardens. A frame wall layer, which constitutes the opening end surface of the IC chip package 3, is made of a ceramics sheet, and irregular unevenness and micropores exist on a surface other than a connecting electrode portion. The melted resin gets through the irregular unevenness and the micropores between the frame wall layer, which constitutes the opening end surface of the IC chip package 3 and then hardens.

Thus, in the case where the container main body of the crystal package 2 is made of a crystal plate, minute unevenness is formed on its outer bottom wall, and a melted resin gets through the minute unevenness and then hardens. This brings an anchor effect, strongly bonding the both with the thermoset resin with solder particles.

An anisotropic conductive layer may be employed for bonding the IC chip package 3 and the crystal package 2 together, instead of the above-described thermoset resin with solder particles. An effect of use of the anisotropic conductive layer is similar to the effect of use of a thermoset resin with solder particles, except a connection formation between the external terminal and the connecting terminal. Even if the container main body of the crystal package is made of a glass material, a crystal controlled oscillator may be constituted with a bonding structure similar to this Embodiment.

The extraction electrodes 24d and 24e are formed at the front and the back of the crystal piece 24c. The extraction electrodes 24d and 24e are extended to the lower surface (the surface facing the IC chip package 3) of the first bottom wall layer 21 via a connecting electrode 11, which is on the bottom surface (the surface facing the IC chip substrate) of the first frame wall layer 22. This forms an external terminal 27, and the external terminal 27 is fixedly secured to the connecting terminal 36 of the IC chip package 3 with the thermoset resin 4 with solder particles 4a. The external terminal 27 and the connecting terminal 36 are fixedly secured by metal bonding with solder particles 4a that are engaged in the both terminals.

The IC chip package 3 housing the IC chip 33 employs a laminated substrate formed of a bottom wall layer (a bottom wall layer of the IC chip package 3, a second bottom wall layer 31) and a frame wall layer (a frame wall layer of the IC chip package 3, a second frame wall layer 32) made of a ceramics sheet. A multilayer sheet may form one or the other of the second bottom wall layer 31 and the second frame wall layer 32. The second bottom wall layer 31 and the second frame wall layer 32 may be made of a crystal plate or a glass plate similar to the crystal package. FIG. 5A illustrates an example in the case where the second bottom wall layer 31 is formed with two-layer ceramics sheet, and a metal film 12 that becomes a shielding electrode is formed between the layers.

The IC chip package 3 includes one principal surface (an IC chip mounting surface), which is the inner bottom surface of the depressed portion 38 (a second depressed portion) of the IC chip package 3 surrounded by the second frame wall layer 32 of the IC chip package 3. The one principal surface includes a wiring pattern and a plurality of electrode pads 35. The second frame wall layer 32 includes a connecting terminal 36 to be connected to an external terminal 27 of the crystal package 2 on the opening end surface. The IC chip package 3 includes the other principal surface (the outer bottom surface of the second bottom wall layer 31, target equipment mounting surface) on which a plurality of mounting terminals 37 (four in this example) is disposed for surface mounting a circuit board of the applied electronic equipment.

The IC chip 33 is fixedly secured to the electrode pad 35 on one principal surface (an inner bottom surface) of the second frame wall layer 32 via mounting bump 34 (such as a solder bump or a gold bump) of the IC chip 33 by an ultrasonic thermo-compression bonding method or similar method. FIG. 5B is a plan view when the IC chip package 3 is viewed from the crystal package 2 side. The IC chip 33 is housed in the second depressed portion 38.

A second container is formed by the second bottom wall layer 31 and the second frame wall layer 32, which constitute the IC chip package 3. The second container includes a plurality of connecting terminal 36 on the opening end surface (the surface of the second frame wall layer 32 facing the external terminal 27 of the crystal package 2) of the second depressed portion 38. The connecting terminal 36 faces and electrically connects to the external terminal 27 of the crystal package 2. The connecting terminal 36 connects to a predetermined circuit terminal of the IC chip 33 through an appropriate through-hole or a via hole 30, which is disposed in the second container, and a wiring (not shown), which is patterned in the inner bottom surface of the second bottom wall layer 31 of the second depressed portion 38.

A vibration signal of the crystal unit 24 of the crystal package 2 is connected to an oscillator circuit through the external terminal 27, a connecting electrode 11, and the connecting terminal 36. The oscillator circuit is integrated into the IC chip 33 housed in the IC chip package 3.

Embodiment 6

Figure 6:
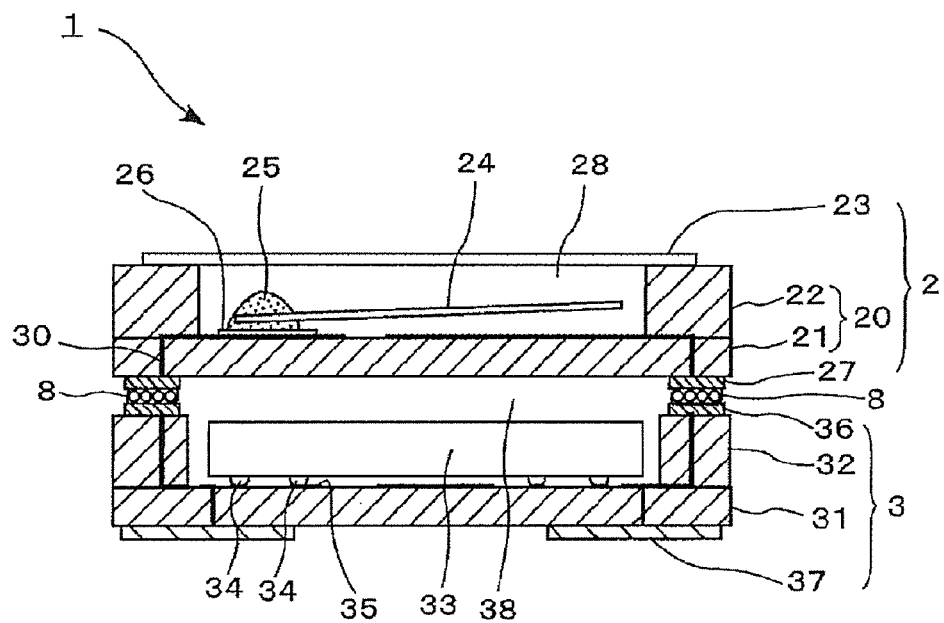
FIGS. 6A and 6B are schematic views illustrating Embodiment 6 where a piezoelectric module according to this disclosure is applied to a crystal controlled oscillator.
Figure 6:
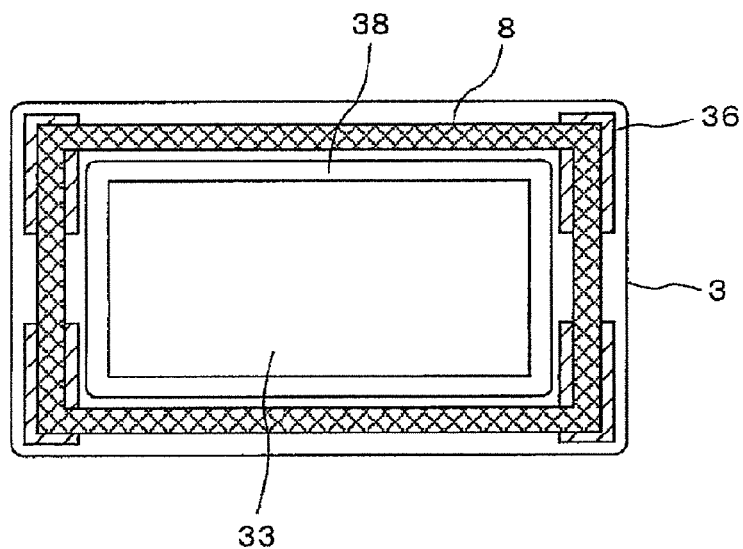

FIGS. 6A and 6B are explanatory views illustrating Embodiment 6 where a piezoelectric module according to this disclosure is applied to a crystal controlled oscillator. FIG. 6A illustrates a cross-sectional view. FIG. 6B illustrates a plan view when the IC chip package of FIG. 6A is viewed from a crystal package side. A crystal controlled oscillator 1 according to Embodiment 6 includes a crystal package 2, which includes a crystal unit 24, and an IC chip package 3, which is a substrate and houses an IC chip 33. The crystal package 2 includes a container main body 20 formed by a first bottom wall layer 21 and a first frame wall layer 22. The container main body 20 includes a first depressed portion 28 surrounded by the first frame wall layer 22 and houses the crystal unit 24. In this embodiment, the crystal unit 24 includes excitation electrodes (not shown) on both front and back surfaces of its thin piece of crystal. Extraction electrodes (similarly, not shown) extending from the respective excitation electrodes to one end edge are fixedly secured to a pair of crystal holding terminals 26 with a conductive adhesive 25. The pair of crystal holding terminals 26 is disposed on an inner bottom surface (one principal surface) of the first depressed portion 28.

The first depressed portion 28 housing the crystal unit 24 is hermetically sealed by a lid body 23 formed of a metal plate, thus forming the crystal package 2. The lid body 23 can also employ a ceramics substrate, a crystal plate, and a hard resin plate, or similar plate. For use of the metal plate as the lid body, the lid body 23 and the first frame wall layer 22 are sealed by seam welding or similar method via a metal thin film similar to the lid body 23. The first bottom wall layer 21 has an outer bottom surface (the other principal surface) on which a terminal 27 (an external terminal) for connecting the IC chip package 3, which houses the IC chip 33, is disposed. The external terminal 27 is connected to the crystal holding terminal 26 though a through-hole or a via hole 30. One or both of the first bottom wall layer 21 and the first frame wall layer 22 may be a multilayer substrate. Further, an electromagnetic shielding film (or an electrode) may be formed on an appropriate surface layer or between layers disposed between the crystal package 2 and the IC chip package 3.

The IC chip package 3 housing the IC chip 33 includes a second bottom wall layer 31 and a second frame wall layer 32, which are made of a ceramics substrate. In this example, the second bottom wall layer 31 is a single layer substrate; however, a multilayer substrate may also be employed. Further, an electromagnetic shielding film (or an electrode) may be formed on an appropriate surface layer or between layers disposed between the IC chip package 3 and the IC chip 33.

One principal surface (an IC chip mounting surface, which is the inner bottom surface of the second depressed portion 38) of the IC chip package 3 includes a plurality of wiring patterns and an electrode pad 35. A plurality of connecting terminals 36 is formed on both end edges of the opening end surface of the second depressed portion 38. The plurality of connecting terminals 36 is disposed for connecting the crystal package 2 via the external terminals 27. The other principal surface (the mounting surface) of the IC chip package 3 has a plurality of mounting terminals 37 to be mounted on the applied electronic equipment. In this embodiment, the mounting terminals 37 are disposed on the respective four corners of the opening end surface of the second depressed portion 38.

The IC chip package 3 includes an anisotropic conductive layer 8 on the opening end surface of the second depressed portion 38 in a portion facing the crystal package 2. The anisotropic conductive layer 8 is disposed on the whole circumference including the top surface of the connecting terminal 36 disposed at the respective four corners. FIG. 6B illustrates the anisotropic conductive layer 8 surrounding narrower than a width of the connecting terminal 36 of the IC chip package 3 to show a position relationship with the connecting terminal 36. However, it is preferred that the anisotropic conductive layer 8 is formed such that the all regions of the width of the opening end surface of the second depressed portion 38 is covered to increase the bonding area.

In bonding of the crystal package 2 and the IC chip package 3, first, a film-shaped anisotropic conductive layer 8 is attached to the opening end surface of the IC chip package 3. The anisotropic conductive material may be shaped into a film to form the anisotropic conductive layer 8 to be attached, punched in a frame shape, and attached to the opening end surface. In view of cost-saving, it is preferred that a tape-shaped or rectangular-shaped anisotropic conductive layer 8 is sequentially attached to the opening end surface. The anisotropic conductive layer 8 may be disposed at the external terminal 27 side of the crystal package 2. The following methods are applicable as alternative methods of forming the anisotropic conductive layer 8: a method of applying a paste-formed anisotropic conductive layer material by screen-printing, a method of drawing and applying the same paste-formed anisotropic conductive layer material with a dispenser, and a method of applying by inkjet.

The outer surface of the first bottom wall layer 21 of the crystal package 2 is attached to the opening end surface of the IC chip package 3 where an anisotropic conductive layer is disposed and then pressurized. This allows conductive fillers dispersed in the anisotropic conductive layer 8 to mutually contact in a pressing force direction so as to form a bridge between the external terminal 27 and the connecting terminal 36 and electrically connect the external terminal 27 and the connecting terminal 36 together. The external terminal 27 and the connecting terminal 36 in this state is heated by passing through a heating furnace or being placed on a hot plate. Then, the resin of the anisotropic conductive layer 8 melts and then hardens. This bonds the crystal package 2 and the IC chip package 3 together on the whole circumference of the opening end surface of the IC chip package 3 while the external terminal 27 and the connecting terminal 36 are electrically connected. Then, the second depressed portion 38 housing the IC chip 33 is sealed.

Embodiment 6 allows housing an IC chip larger than the conventional IC chip in the IC chip package that has the same size as the crystal package. The outer bottom surface of the crystal package is electrically bonded to the opening end surface of the second depressed portion of the IC chip package at the both terminals with the anisotropic conductive layer. The whole circumference of the opening end surface of the second depressed portion of the IC chip package is fixedly secured to the outer bottom surface of the crystal unit with the anisotropic conductive layer. Accordingly, the crystal package is electrically connected with the IC chip package and is mechanically and strongly bonded on the whole circumference of the opening end surface of the second depressed portion of the IC chip package. Then, the housed IC chip is sealed. This prevents the outside atmosphere to enter, and also prevents intrusion of dust and humidity and improves reliability of an operation of the crystal controlled oscillator.

Embodiment 7

Figure 7A:
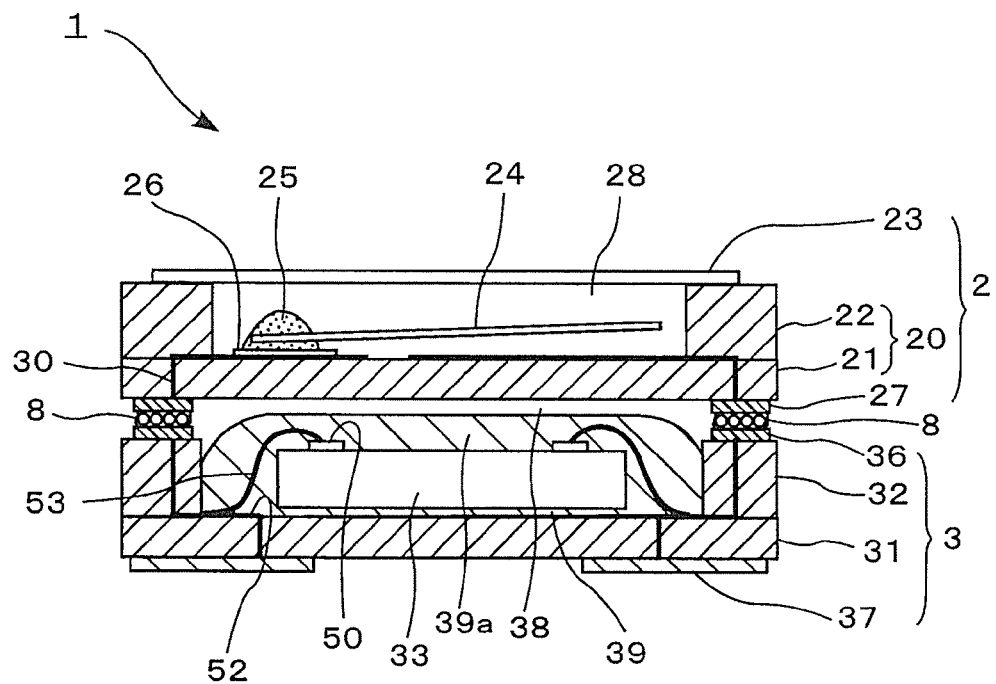
FIGS. 7A and 7B are schematic views illustrating Embodiment 7 where a piezoelectric module according to this disclosure is applied to a crystal controlled oscillator.
Figure 7B:
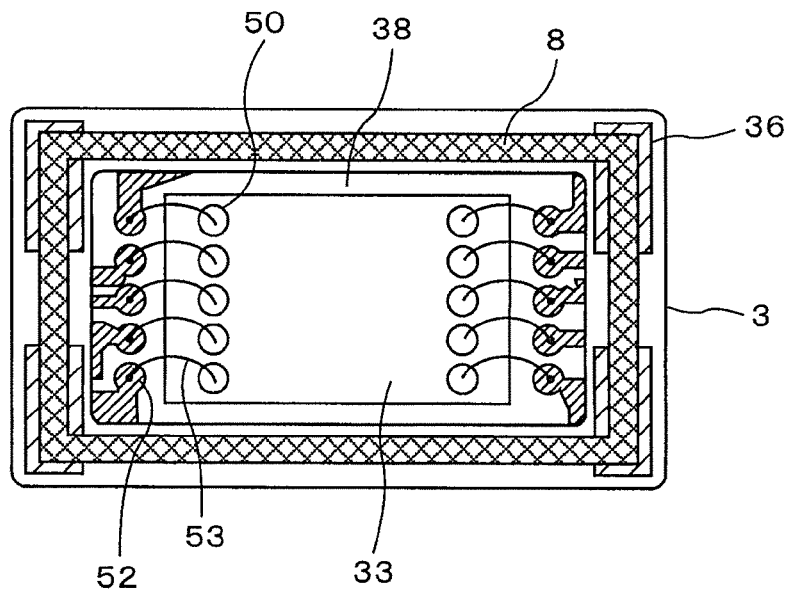

FIGS. 7A and 7B are explanatory views illustrating Embodiment 7 where a piezoelectric module according to this disclosure is applied to a crystal controlled oscillator. FIG. 7A illustrates a cross-sectional view. FIG. 7B illustrates a plan view when the IC chip package of FIG. 7A is viewed from a crystal package side. Embodiment 7 differs from Embodiment 6 in a mounting structure of an IC chip of an IC chip package 3. Embodiment 7 is otherwise approximately similar to Embodiment 6. In the IC chip package 3 according to Embodiment 7, the IC chip 33 housed in a second depressed portion 38 is connected to a circuit terminal 52 by a wire bonding method as illustrated in FIG. 7B. With this method, a die pad 50 is connected to the circuit terminal 52 on the inner bottom surface of the second depressed portion 38 of the IC chip package 3 with a bonding wire 53.

Similarly to Embodiment 6, a film-shaped anisotropic conductive layer 8 is attached to the opening end surface of the IC chip package 3. The anisotropic conductive layer 8 to be attached may be punched in a frame shape and attached to the opening end surface. In view of cost-saving, it is preferred that a tape-shaped or rectangular-shaped anisotropic conductive layer 8 is sequentially attached to the opening end surface. The anisotropic conductive layer 8 may be disposed on the external terminal 27 side of the crystal package 2. The following methods are applicable as alternative methods of forming the anisotropic conductive layer 8: a method of applying a paste-formed anisotropic conductive layer material by screen-printing, a method of drawing and applying the same paste-formed anisotropic conductive layer material with a dispenser, and a method of applying by inkjet.

The IC chip 33 is fixedly secured to the inner bottom surface of the second depressed portion 38 with an adhesive 39. Alternatively, the IC chip 33 is preferred to be strongly fixed as follows. The whole IC chip 33 is molded in the second depressed portion 38 with a sealing resin 39a (underfill), which uses an epoxy resin as a base agent and preferably to be a liquid curable resin. The adhesive 39 and the sealing resin 39a may be made of the same material. The addition of silicon oxide or similar to the sealing resin 39a or similar restricts thermal distortion.

In Embodiment 7, the outer surface of a first bottom wall layer 21 of the crystal package 2 is attached to the opening end surface of the IC chip package 3 on which an anisotropic conductive layer is formed, and they are pressurized similarly to Embodiment 6. This allows conductive particles dispersed in the anisotropic conductive layer 8 to mutually contact in a pressing force direction so as to form a bridge between the external terminal 27 and the connecting terminal 36 and electrically connect the external terminal 27 and the connecting terminal 36 together. The external terminal 27 and the connecting terminal 36 in this state is heated by passing through a heating furnace or being placed on a hot plate. Then, the resin of the anisotropic conductive layer 8 melts and then hardens. Then, the crystal package 2 and the IC chip package 3 are fixedly secured while the external terminal 27 and the connecting terminal 36 are electrically connected.

Embodiment 7 allows housing an IC chip larger than the conventional IC chip in the IC chip package that has the same size as the crystal package. The crystal package is electrically bonded to the opening end surface of the second depressed portion of the IC chip package at the both terminals with the anisotropic conductive layer. Besides, the whole circumference of the opening end surface of the second depressed portion of the IC chip package is fixedly secured by hardening of a resin constituting the anisotropic conductive layer. Accordingly, the crystal package electrically connects to the IC chip package, and the both are mechanically and strongly connected together. Further, the housed IC chip is sealed. This prevents the outside atmosphere to enter and also improves reliability of an operation of the crystal controlled oscillator.

Embodiment 8

Figure 8:
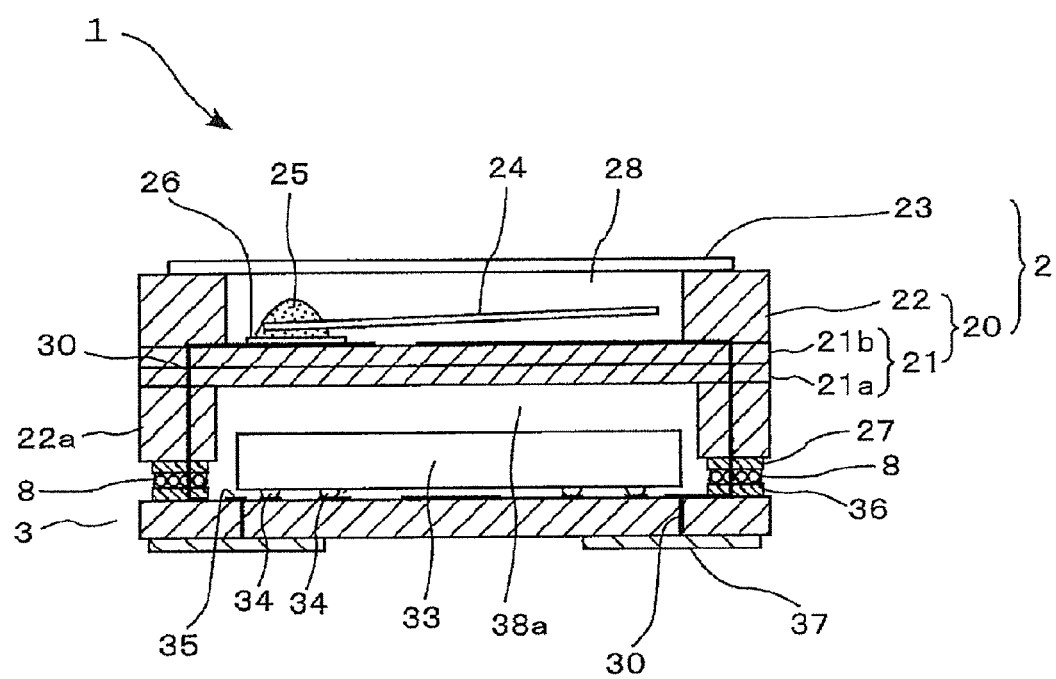
FIG. 8 is a schematic cross-sectional view illustrating Embodiment 8 where a piezoelectric module according to this disclosure is applied to a crystal controlled oscillator.

FIG. 8 is a schematic cross-sectional view illustrating a structure of Embodiment 8 where a piezoelectric module according to this disclosure is applied to a crystal controlled oscillator. In Embodiment 8, the crystal package 2 includes the first bottom wall layer 21 with the outer surface and another frame wall layer, which is a first addition frame wall layer 22a. These form a second addition depressed portion 38a that forms a housing space of an IC chip 33. An external terminal 27 is formed on the opening end surface of the second addition depressed portion 38a. The IC chip 33 is housed in the IC chip package 3. The IC chip 33 connects its mounting bump 34 to an electrode pad 35 disposed on one principal surface (a surface facing the crystal package 2) of the IC chip package 3. Bonding of the IC chip package 3 to the crystal package 2 allows housing the IC chip 33 in the second addition depressed portion 38a.

Connecting terminals 36 are formed at four corners of the IC chip package 3 and face the opening end surface forming the second addition depressed portion 38a of the crystal package 2. Similarly to Embodiment 6 and Embodiment 7, an anisotropic conductive layer 8 is disposed to cover the connecting terminals 36. The anisotropic conductive layer 8 may be disposed on the external terminal 27 side of the crystal package 2. The IC chip 33 may be fixedly secured to the inner bottom surface of the IC chip package 3 with an adhesive.

The connecting terminal 36 on which the anisotropic conductive layer 8 is disposed of the IC chip package 3 is attached to the opening end surface of the second addition depressed portion 38a of the crystal package 2 and is pressurized. This allows conductive particles dispersed in the anisotropic conductive layer 8 to mutually contact in a pressing force direction so as to form a bridge between the external terminal 27 and the connecting terminal 36 and electrically connect the external terminal 27 and the connecting terminal 36 together. The external terminal 27 and the connecting terminal 36 in this state is heated by passing through a heating furnace or being placed on a hot plate. Then, the resin of the anisotropic conductive layer 8 melts and then hardens. The crystal package 2 and the IC chip package 3 are strongly bonded while the external terminal 27 and the connecting terminal 36 are electrically connected together.

Embodiment 8 allows housing an IC chip larger than the conventional IC chip in the IC chip package that has the same size as the crystal package and integrating the packages. The terminals of the crystal package and the IC chip package are electrically bonded with the anisotropic conductive layer. Besides, the whole circumference of the opening end surface of the second addition depressed portion 38a formed on the first addition frame wall layer 22a is fixedly secured to the IC chip package 3 with the anisotropic conductive layer. Accordingly, the crystal package is electrically, mechanically, and strongly fixed to the IC chip package. Further, the IC chip housed in the IC chip package is sealed. This prevents the outside atmosphere to enter, and also prevents intrusion of humidity and dust, thus improving reliability of the crystal controlled oscillator.

In Embodiment 6 and Embodiment 8, the IC chip 33 is fixedly secured to the electrode pad 35 via mounting bump 34 (such as a gold bump) of the IC chip 33 by an ultrasonic thermo-compression bonding method or similar method. In Embodiment 7, the IC chip 33 is mounted on the IC chip package 3 by wire bonding. However, it is apparent that other known mounting methods are applicable as a method of mounting the IC chip 33 to the IC chip package 3 according to this disclosure.

Concrete examples of a crystal controlled oscillator according to this disclosure will be described below as Embodiment 9 to Embodiment 13 with referring to FIGS. 9A to 21. FIGS. 22A to 22E illustrate an exemplary fabrication process. Other concrete examples will be described as Embodiment 14 to Embodiment 18 with referring to FIGS. 23A to 35. FIGS. 36A to 36D illustrate an exemplary fabrication process.

Embodiment 9

FIGS. 9A to 9C are external views of a crystal controlled oscillator illustrating Embodiment 9 according to this disclosure. FIG. 9A illustrates a top surface (a planar surface). FIG. 9B illustrates a side surface in a longer side direction. FIG. 9C illustrates a side surface in a shorter side direction. A crystal controlled oscillator 1 according to this embodiment is generally referred to as "1612 size TCXO" and is a crystal controlled oscillator where an IC chip package 3 is bonded to a crystal package 2. This entire crystal controlled oscillator 1 is slightly larger than the crystal package 2 by an area for a dicing space, but is still a low-profile product that bonds the IC chip package 3 having a planar view size approximately equal to the crystal package 2. As a product of the crystal controlled oscillator 1 to which the IC chip package 3 is bonded, the IC chip package 3 has sizes of 1.6 mm in the longer side direction and 1.2 mm in the shorter side direction.

This crystal controlled oscillator 1 includes the crystal package 2 and the IC chip package 3, which are bonded in two levels in the vertical direction with a thermoset resin with solder particles 4, thus forming an integrated electronic component. The crystal package 2 may employ any of crystal packages illustrated in FIGS. 1 to 8. Here, the crystal package 2 in FIG. 5A is employed.

FIG. 10 is a view illustrating the bottom surface (the outer surface, the mounting surface of an applied equipment) of the crystal controlled oscillator 1 in FIGS. 9A to 9C. Four surface mount type mounting terminals 37 are disposed on the bottom surface. As illustrated in FIG. 10, these terminals function as a grounding terminal (GND), an output terminal (OUTPUT), a power source terminal (Vcc), and an E/D terminal (Enable/Disable) or AFC terminal.

FIGS. 11A and 11B are explanatory views of an IC chip housing portion of the IC chip package of the crystal controlled oscillator 1 illustrated in FIGS. 9A to 9C. FIG. 11A illustrates a plan view viewed from a crystal package side. FIG. 11B is a cross-sectional view taken along the line XIB-XIB of FIG. 11A. The IC chip 33 illustrated in FIG. 11B is mounted by connecting a bump (not shown) of the IC chip 33 to an electrode pad 35 disposed at a wiring pattern on the inner bottom of a second depressed portion 38 of the IC chip package 3. The IC chip 33 may be mounted by wire bonding. The dashed line forming a rectangular shape in FIG. 11A is an imaginary line indicative of a position on which the crystal package 2 is to be bonded. The external size of the IC chip package 3 is only slightly large.

Embodiment 10

FIGS. 12A to 12C are external views of a crystal controlled oscillator illustrating Embodiment 10 where a piezoelectric module according to this disclosure is applied to a crystal controlled oscillator. FIG. 12A illustrates a top surface (a planar surface). FIG. 12B illustrates a side surface in a longer side direction. FIG. 12C illustrates a side surface in a shorter side direction. A crystal controlled oscillator 1 according to this embodiment is generally referred to as "2016 size TCXO" and includes the crystal package 2 with the same size as the crystal package 2 used for the above-described "1612 size TCXO" to which the IC chip package 3 is bonded. This IC chip package 3 is slightly larger than the crystal package 2. The crystal controlled oscillator 1 has sizes of 2.0 mm in the longer side direction and 1.6 mm in the shorter side direction. A sufficient dicing space size is provided.

Similarly to the above-described crystal controlled oscillator, this crystal controlled oscillator 1 includes the crystal package 2 and the IC chip package 3, which are bonded in two levels in the vertical direction with a thermoset resin 4 with solder particles, thus forming an integrated electronic component.

FIG. 13 is a view illustrating the bottom surface (the outer surface, the mounting surface of an applied equipment) of the crystal controlled oscillator 1 in FIGS. 12A to 12C. Four surface mount type mounting terminals 37 are disposed on the bottom surface. As illustrated in FIG. 13, these terminals function as a grounding terminal (GND), an output terminal (OUTPUT), a power source terminal (Vcc), and an E/D terminal (Enable/Disable) or AFC terminal.

FIGS. 14A and 14B are explanatory views of an IC chip housing portion of the IC chip package of the crystal controlled oscillator 1 illustrated in FIGS. 12A to 12C. FIG. 14A illustrates a plan view viewed from a crystal package side. FIG. 14B is a cross-sectional view taken along the line XIVB-XIVB of FIG. 14A. An IC chip 33 is mounted by connecting a bump (not shown) of the IC chip to an electrode pad 35 disposed at a wiring pattern on the inner bottom of a second depressed portion 38 of the IC chip package 3. The IC chip 33 may be mounted by wire bonding. The dashed line forming a rectangular shape in FIG. 14A is an imaginary line indicative of a position on which the crystal package 2 is to be bonded.

Embodiment 11

FIGS. 15A to 15C are external views of a crystal controlled oscillator illustrating Embodiment 11 according to this disclosure. FIG. 15A illustrates a top surface (a planar surface). FIG. 15B illustrates a side surface in a longer side direction. FIG. 15C illustrates a side surface in a shorter side direction. A crystal controlled oscillator 1 according to this embodiment is generally referred to as "3215 size TCXO" and includes a crystal package 2, which houses a tuning-fork type crystal unit, bonded to an IC chip package 3.

The container main body of the crystal package 2 is made of a ceramics sheet. However, this should not be construed in a limiting sense. An insulating material such as a crystal plate and a glass plate may be used. The crystal controlled oscillator 1 has sizes of 3.2 mm in the longer side direction and 1.5 mm in the shorter side direction. In this embodiment, the IC chip package 3 is slightly larger than the crystal package 2 by an area for a dicing space. A further large IC chip package 3 may be employed.

Similarly to the above-described crystal controlled oscillator, this crystal controlled oscillator 1 includes the crystal package 2 and the IC chip package 3, which are bonded in two levels in the vertical direction with a thermoset resin 4 with solder particles, thus forming an integrated electronic component.

FIG. 16 is a view illustrating the bottom surface (the outer surface, the mounting surface of an applied equipment) of the crystal controlled oscillator 1 in FIGS. 15A to 15C. Four surface mount type mounting terminals 37 are disposed on the bottom surface. As illustrated in FIG. 16, these terminals function as a grounding terminal (GND), an output terminal (OUTPUT), a power source or a grounding terminal (Vcc or GND), and a power source terminal (Vcc).

FIGS. 17A and 17B are explanatory views of an IC chip housing portion of the IC chip package of the crystal controlled oscillator 1 illustrated in FIGS. 15A to 15C. FIG. 17A illustrates a plan view viewed from a crystal package side. FIG. 17B is a cross-sectional view taken along the line XVIIB-XVIIB of FIG. 17A. An IC chip 33 is mounted by connecting a bump (not shown) of the IC chip 33 to an electrode pad 35 disposed at a wiring pattern on the inner bottom of a second depressed portion 38 of the IC chip package 3. The IC chip 33 may be mounted by wire bonding. The dashed line forming a rectangular shape in FIG. 17A is an imaginary line indicative of a position on which the crystal package 2 is to be bonded.

Embodiment 12

FIGS. 18A to 18C are external views of a crystal unit with temperature sensor illustrating Embodiment 12 where a piezoelectric module according to this disclosure is applied to a crystal controlled oscillator. FIG. 18A illustrates a top surface (a planar surface). FIG. 18B illustrates a side surface in a longer side direction. FIG. 18C illustrates a side surface in a shorter side direction. A crystal unit according to this embodiment is generally referred to as "1612 size crystal unit with temperature sensor", which embeds a temperature sensor such as a thermistor. The crystal unit is generally employed as a replacement of TCXO for a mobile phone.

This crystal unit with temperature sensor 1A is also constituted by bonding an IC chip package 3 to a crystal package 2. The IC chip package 3 includes a thermistor or a diode only. The thermistor or the diode may be employed as an element that constitutes any circuit on an applied electronic equipment side. As described above, the IC chip package 3 includes an IC chip package on which an element other than an IC is mounted for convenience of explanation.

This entire crystal unit with temperature sensor 1A is slightly larger than the crystal package 2 by an area for a dicing space, but is still a low-profile product that bonds the IC chip package 3 having a planar view size approximately equal to the crystal package 2, similarly to the one illustrated in FIGS. 9A to 9C. As a product of the crystal controlled oscillator 1 to which the IC chip package 3 is bonded, the IC chip package 3 has sizes of 1.6 mm in the longer side direction and 1.2 mm in the shorter side direction.

This crystal unit with temperature sensor 1A includes the crystal package 2 and the IC chip package 3, which are bonded in two levels in the vertical direction with a thermoset resin 4 with solder particles, thus forming an integrated electronic component. The crystal package 2 may employ any of crystal packages illustrated in FIGS. 1 to 8. Here, the crystal package 2 in FIG. 5A is employed. As a temperature sensor, for example, a diode is applicable as well as a thermistor.

FIG. 19 is a view illustrating the bottom surface (the outer surface, the mounting surface of an applied equipment) of the crystal unit with temperature sensor 1A in FIGS. 18A to 18C. Four surface mount type mounting terminals 37 are disposed on the bottom surface. As illustrated in FIG. 19, these terminals function as an output terminal (Xtal OUT) of the crystal unit with temperature sensor 1A, an output terminal (S/D OUT) of a thermistor or a diode, an input terminal (Xtal IN) of the crystal unit 1A with temperature sensor, and an input terminal (S/D IN) of the thermistor or the diode.

FIGS. 20A to 20C are explanatory views of a mounting portion of the thermistor or the diode of the IC chip package of the crystal unit with temperature sensor 1A in FIGS. 18A to 18C. FIG. 20A illustrates a plan view viewed from a crystal package side. FIG. 20B is a cross-sectional view taken along the line XXB-XXB of FIG. 20A and an exemplary mounting of a thermistor 7 on a second depressed portion 38. FIG. 20C illustrates an exemplary mounting of a diode 17 on the second depressed portion 38. The thermistor 7 or the diode 17 uses its temperature characteristic and is connected to an electrode pad 35 disposed at a wiring pattern on the inner bottom of the second depressed portion 38 of the IC chip package 3 for mounting. The dashed line forming a rectangular shape in FIG. 20A is an imaginary line indicative of a position on which the crystal package 2 is to be bonded. The external size of the IC chip package 3 is slightly larger than that of the crystal package 2.

Next, one exemplary fabrication method of a piezoelectric module according to this disclosure will be described with the crystal controlled oscillator of FIGS. 9A to 9C using the crystal package illustrated in FIG. 5A as one Embodiment (Embodiment 13). A crystal controlled oscillator using a crystal package and an IC chip package of another type can also be fabricated by a similar process.

Embodiment 13

FIG. 21 is a cross-sectional view of the main part of the crystal controlled oscillator illustrated in FIGS. 9A to 9C. The crystal controlled oscillator is a target of one exemplary fabrication method of this disclosure. This crystal controlled oscillator 1 includes a second depressed portion 38 of an IC chip package 3 that houses an IC chip 33. A thermoset resin 4 with solder particles is applied on the whole circumference of the opening end surface of the second depressed portion 38. Thus, the IC chip package 3 and the crystal package 2 are integrated by bonding such that the opening is covered with the bottom surface of the crystal package 2.

FIGS. 22A to 22E are fabrication process views of the main part of the crystal controlled oscillator according to this disclosure, which illustrate one exemplary fabrication method of the crystal controlled oscillator. In this fabrication method, the crystal controlled oscillator of a predetermined structure is fabricated by performing steps described below with following the arrows in FIGS. 22A to 22E. The following describes each step. Each component member in FIGS. 22A to 22E can be understood with referring to each above-described embodiment.

Step A: A mother sheet 3A made of a ceramics sheet where a large number of IC chip packages are fabricated is prepared. After individual crystal package is bonded, the mother sheet 3A is to be separated into individual crystal controlled oscillator by dicing. The bottom wall layer of the mother sheet 3A is constituted of two laminated ceramics sheets. A metal film 12 (a shielding electrode), which functions as a shielding, is formed on the inner layer to cover a housing region of the IC chip 33. The second depressed portion 38, which is formed by a frame wall layer, houses the IC chip 33. A connecting terminal 36 is formed on the opening end surface (a top surface of a sidewall layer that constitutes the second depressed portion 38) of the second depressed portion 38.

Step B: A layer of the thermoset resin with solder particles 4 is formed on the opening end surface (the top surface of the sidewall layer that constitutes the second depressed portion 38) of the second depressed portion 38. The thermoset resin with solder particles 4 is formed on the whole circumference of the opening end surface including the connecting terminal 36 (the arrow C). To form the thermoset resin 4 with solder particles, a known pattern formation method with minute slurry, such as a dispenser application, screen-printing, and inkjet coating, is applicable.

Step C: Individual crystal package 2 (referred to as an individual crystal package piece before the crystal controlled oscillator crystal is separated individually) is placed to each opening end surface of individual second depressed portion 38 where the thermoset resin with solder particles 4 layer is formed. In this state, a pressurization (the arrow P) and a heating (the arrow H) processes are performed to the individual crystal package piece and the mother sheet 3A. At this time, solder particles of the thermoset resin with solder particles 4 melt, spread, and wet the external terminal 27 of the individual crystal package piece and the connecting terminal 36 disposed at the individual IC chip package of the mother sheet 3A. Accordingly, the thermoset resin of the thermoset resin with solder particles 4 also melts. The melted resin fills in between a whole circumference of the opening end surface including the connecting terminals 36, which faces the individual crystal package piece and disposed on the individual IC chip package on the mother sheet 3A, and the external terminal 27 of the individual IC chip package.

Step D: The melted solder particles sufficiently spread and wet between the external terminal 27 of the individual crystal package piece and the connecting terminal 36 of the mother sheet 3A. After elapse of predetermined time taken for the melted resin to sufficiently fill in between the opening end surface of the mother sheet 3A and the individual crystal package piece, the heating process is halted to remove heat. Then, the melted solder is solidified and bonds the external terminal of the crystal package 2 and the connecting terminal of the mother sheet 3A together by metal bonding. The thermoset resin hardens between the opening end surface of the mother sheet 3A and the crystal package. Each individual piece of the crystal package electrically connects to and mechanically and strongly bonds to the mother sheet 3A.

Step E: The mother sheet 3A, where each individual piece of the crystal package is bonded, is diced at a boundary with the individual crystal package piece. This obtains an individual crystal controlled oscillator 1 (FIG. 21), which includes the IC chip package 3 bonded to the crystal package 2.

The crystal controlled oscillator 1 illustrated in FIG. 21 is fabricated in the above-described steps. A description will be further given of a bonding structure of the crystal package 2 and the IC chip package 3.

As details are illustrated in FIG. 5A, the crystal package 2 constituting a crystal controlled oscillator illustrated in FIG. 21 is formed by a first bottom wall layer 21, a first frame wall layer 22, and a lid body 23, all of which are made of a crystal plate. On the other hand, the IC chip package 3 is formed by a laminated ceramics sheet. A thermoset resin included in the thermoset resin 4 with solder particles contains an epoxy resin as a base agent. Generally, the larger the surface area of the bonding surface is, the stronger the bonding is.

In this disclosure, as described in FIG. 5A, surface treatment, which forms a large number of minute unevenness 29a, is performed to an outer bottom surface 29 of the first bottom wall layer 21 of a container main body of the crystal package 2 facing the IC chip package 3. This surface treatment is performed on the whole region of the outer bottom surface 29 except the external terminal 27 or at a surrounding portion facing the opening end surface of the IC chip package 3.

In the case where the IC chip package 3 is bonded to the crystal package 2 with the thermoset resin with solder particles, a melted solder and a melted resin get through a minute unevenness 29a formed on the outer bottom surface 29 of the crystal package 2 except an external terminal formation portion and then hardens. This generates an anchor effect (in a state where the resin is secured by an anchor), thus strongly bonding the both with the thermoset resin with solder particles.

An anisotropic conductive layer may substitute for the thermoset resin with solder particles. The effect differs in a connection formation between the external terminal and the connecting terminal, but is otherwise similar to bonding using the thermoset resin with solder particles. As described above, in the case where the container main body of the crystal package is made of a glass material, a crystal controlled oscillator may be constituted with a bonding structure similarly to this Embodiment.

Embodiment 14

FIGS. 23A to 23C are external views of a crystal controlled oscillator illustrating Embodiment 14 where a piezoelectric module according to this disclosure is applied to a crystal controlled oscillator. FIG. 23A illustrates a top surface (a planar surface). FIG. 23B illustrates a side surface in a longer side direction. FIG. 23C illustrates a side surface in a shorter side direction. A crystal controlled oscillator 1 according to this Embodiment is generally referred to as "1612 size TCXO" similar to the above-described concrete example and is a crystal controlled oscillator where an IC chip package 3 is bonded to a crystal package 2. This crystal controlled oscillator 1 is a low-profile product that bonds the crystal package 2 to the IC chip package 3 having a planar view size approximately equal to that of the crystal package 2. As a product of the crystal controlled oscillator 1 to which the IC chip package 3 is bonded, the crystal controlled oscillator 1 has sizes of 1.6 mm in the longer side direction and 1.2 mm in the shorter side direction.

This crystal controlled oscillator 1 includes the crystal package 2 and the IC chip package 3, which are bonded in two levels in the vertical direction with a thermoset resin with solder particles 4, thus forming an integrated electronic component. The crystal package 2 may employ any of crystal packages illustrated in FIGS. 1 to 8. Here, the crystal package 2 in FIG. 5A is employed.

Notches 5 (castellations) are disposed at four corners of the IC chip package 3, which constitutes the crystal controlled oscillator 1, in the thickness direction. The notch 5 includes a connecting electrode 51. The connecting electrode 51 electrically connects a mounting terminal 37 to a wiring, which is extracted from an IC chip mounted inside of the IC chip package 3 to a sidewall.

FIG. 24 is a view illustrating the bottom surface (the outer surface, the mounting surface of an applied equipment) of the crystal controlled oscillator 1 in FIGS. 23A to 23C. Four surface mount type mounting terminals 37 are disposed on the bottom surface. As illustrated, these terminals function as a grounding terminal (GND), an output terminal (OUTPUT), a power source terminal (Vcc), and an E/D terminal (Enable/Disable) or AFC terminal.

FIGS. 25A and 25B are explanatory views of an IC chip housing portion of the IC chip package of the crystal controlled oscillator 1 illustrated in FIGS. 23A to 23C. FIG. 25A illustrates a plan view viewed from a crystal package side. FIG. 25B is a cross-sectional view taken along the line XXVB-XXVB of FIG. 25A. The IC chip 33 illustrated in FIG. 25B is mounted by connecting a bump (not shown) of the IC chip 33 to an electrode pad 35 disposed at a wiring pattern on the inner bottom of a second depressed portion 38 of the IC chip package 3. The IC chip 33 may be mounted by wire bonding.

Embodiment 15

Figures 26A, 26B, 26C:
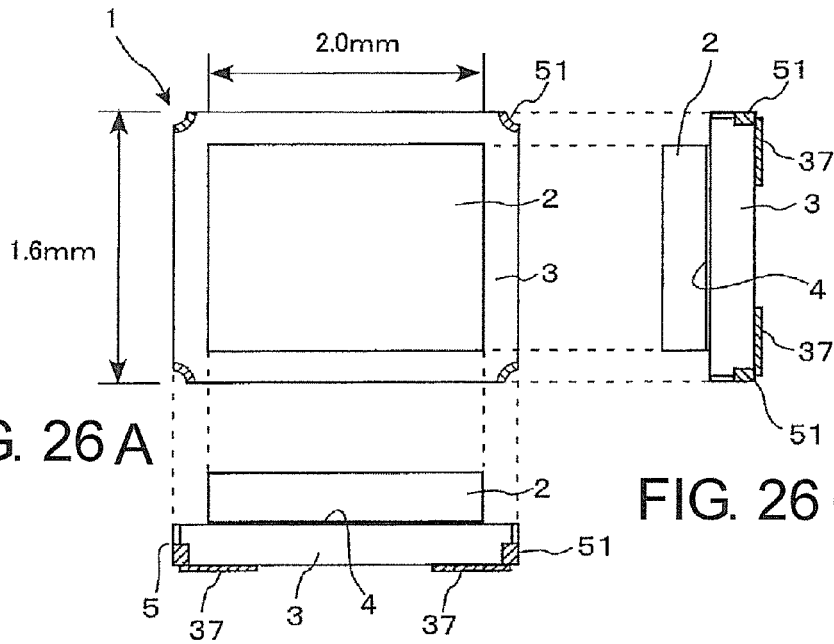
FIGS. 26A to 26C are external views of a crystal controlled oscillator illustrating Embodiment 15 where a piezoelectric module according to this disclosure is applied to a crystal controlled oscillator.

FIGS. 26A to 26C are external views of a crystal controlled oscillator illustrating Embodiment 15 where a piezoelectric module according to this disclosure is applied to a crystal controlled oscillator. FIG. 26A illustrates a top surface (a planar surface). FIG. 26B illustrates a side surface in a longer side direction. FIG. 26C illustrates a side surface in a shorter side direction. A crystal controlled oscillator 1 according to this Embodiment is generally referred to as "2016 size TCXO" and includes the crystal package 2 with the same size as the crystal package 2 used for the above-described "1612 size TCXO" to which the IC chip package 3 is bonded. This IC chip package 3 is slightly larger than the crystal package 2. The crystal controlled oscillator 1 has sizes of 2.0 mm in the longer side direction and 1.6 mm in the shorter side direction.

Notches 5 (castellations) are disposed at four corners of the IC chip package 3, which constitutes the crystal controlled oscillator 1, in the thickness direction. The notch 5 includes a connecting electrode 51. The connecting electrode 51 electrically connects a mounting terminal 37 to a wiring, which is extracted from an IC chip mounted inside of the IC chip package 3 to a sidewall.

Similarly to the above-described crystal controlled oscillator, this crystal controlled oscillator 1 includes the crystal package 2 and the IC chip package 3, which are bonded in two levels in the vertical direction with a thermoset resin with solder particles 4, thus forming an integrated electronic component.

Figure 27:
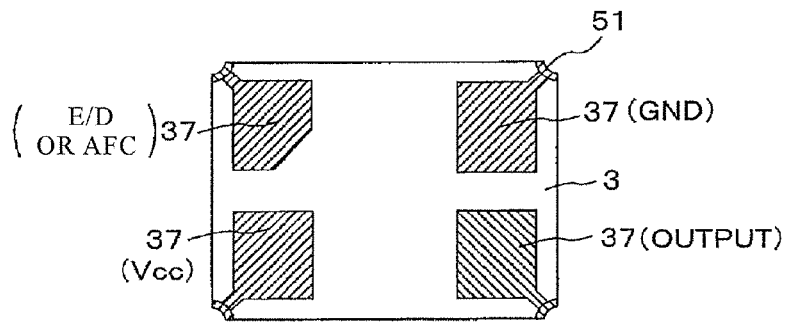
FIG. 27 is a plan view illustrating the bottom surface of the crystal controlled oscillator illustrated in FIGS. 26A to 26C.

FIG. 27 is a view illustrating the bottom surface (the outer surface, the mounting surface of an applied equipment) of the crystal controlled oscillator 1 in FIGS. 26A to 26C. Four surface mount type mounting terminals 37 are disposed on the bottom surface. As illustrated in FIG. 27, these terminals function as a grounding terminal (GND), an output terminal (OUTPUT), a power source terminal (Vcc), and an E/D terminal (Enable/Disable) or AFC terminal. Each mounting terminal is connected to a wiring (not shown) extracted from the IC chip to a sidewall at the connecting electrode 51 in the notch 5.

Figures 28A, 28B:
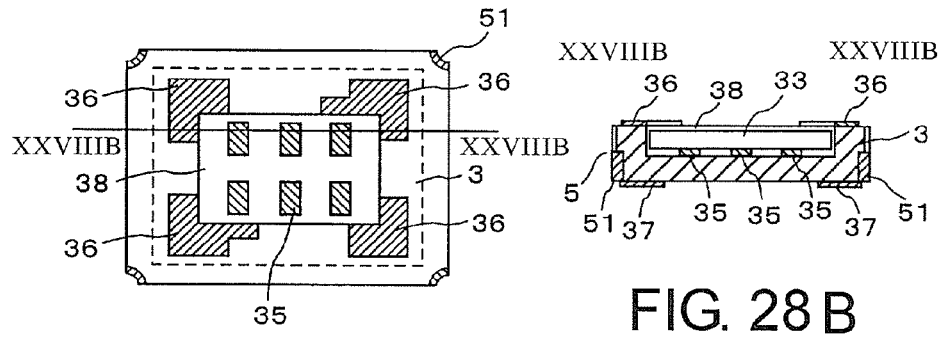
FIGS. 28A and 28B are explanatory views of the IC chip housing portion of the IC chip package of the crystal controlled oscillator illustrated in FIGS. 26A to 26C.

FIGS. 28A and 28B are explanatory views of an IC chip housing portion of the IC chip package of the crystal controlled oscillator 1 illustrated in FIGS. 26A to 26C. FIG. 28A illustrates a plan view viewed from a crystal package side.

FIG. 28B is a cross-sectional view taken along the line XXVIIIB-XXVIIIB of FIG. 28A. The IC chip 33 is mounted by connecting a bump (not shown) of the IC chip 33 to an electrode pad 35 disposed at a wiring pattern on the inner bottom of a second depressed portion 38 of the IC chip package 3. The IC chip 33 may be mounted by wire bonding. The dashed line forming a rectangular shape in FIG. 28A is an imaginary line indicative of a position on which the crystal package 2 is to be bonded.

Embodiment 16

FIGS. 29A to 29C are external views of a crystal controlled oscillator illustrating Embodiment 16 where a piezoelectric module according to this disclosure is applied to a crystal controlled oscillator. FIG. 29A illustrates a top surface (a planar surface). FIG. 29B illustrates a side surface in a longer side direction. FIG. 29C illustrates a side surface in a shorter side direction. A crystal controlled oscillator 1 according to this Embodiment is generally referred to as "3215 size TCXO" and includes a crystal package 2, which houses a tuning-fork type crystal unit, bonded to an IC chip package 3.

The container main body of the crystal package 2 is made of a ceramics sheet. However, this should not be construed in a limiting sense. An insulating material such as a crystal plate and a glass plate may be used. The crystal controlled oscillator 1 has sizes of 3.2 mm in the longer side direction and 1.5 mm in the shorter side direction. According to this Embodiment, the IC chip package 3 is slightly larger than the crystal package 2. A larger IC chip package 3 may be employed.

Notches 5 (castellations) are disposed at four corners of the crystal controlled oscillator 1 where the IC chip package 3 and the crystal package 2 are stacked in the thickness direction. An output terminal of a crystal unit mounted on the crystal package 2 is extracted to a sidewall and electrically connected to an external terminal 27 at a connecting electrode 52 (see FIG. 5A). The connecting electrode 51 of the IC chip package 3 electrically connects a wiring to a mounting terminal 37 extracted from an IC chip to a sidewall.

Similarly to the above-described crystal controlled oscillator, this crystal controlled oscillator 1 includes the crystal package 2 and the IC chip package 3, which are bonded in two levels in the vertical direction with a thermoset resin 4 with solder particles, thus forming an integrated electronic component.

FIG. 30 is a view illustrating the bottom surface (the outer surface, the mounting surface of an applied equipment) of the crystal controlled oscillator 1 in FIGS. 29A to 29C. Four surface mount type mounting terminals 37 are disposed on the bottom surface. As illustrated, these terminals function as a grounding terminal (GND), an output terminal (OUTPUT), a power source or a grounding terminal (Vcc or GND), and a power source terminal (Vcc).

FIGS. 31A and 31B are explanatory views of an IC chip housing portion of the IC chip package of the crystal controlled oscillator 1 illustrated in FIGS. 29A to 29C. FIG. 31A illustrates a plan view viewed from a crystal package side. FIG. 31B is a cross-sectional view taken along the line XXXIB-XXXIB of FIG. 31A. An IC chip 33 is mounted by connecting a bump (not shown) of the IC chip to an electrode pad 35 disposed at a wiring pattern on the inner bottom of a second depressed portion 38 of the IC chip package 3. The IC chip 33 may be mounted by wire bonding.

Embodiment 17

FIGS. 32A to 32C are external views of a crystal unit with temperature sensor illustrating Embodiment 17 according to this disclosure. FIG. 32A illustrates a top surface (a planar surface). FIG. 32B illustrates a side surface in a longer side direction. FIG. 32C illustrates a side surface in a shorter side direction. A crystal unit according to this Embodiment is generally referred to as "1612 size crystal unit with temperature sensor", which embeds a temperature sensor such as a thermistor. The crystal unit is generally employed as a replacement of TCXO for a mobile phone.

This crystal unit with temperature sensor 1A is also constituted by bonding an IC chip package 3 to a crystal package 2. The IC chip package 3 includes a thermistor or a diode only. The thermistor or the diode may be employed as an element that constitutes any circuit on an applied electronic equipment side. As described above, the IC chip package 3 includes an IC chip package on which an element other than an IC is mounted for convenience of explanation.

The crystal unit with temperature sensor 1A is a low-profile product that bonds the IC chip package 3 and the crystal package 2 having approximately equal size in planar view, similarly to the IC chip package 3 and the crystal package 2 in FIGS. 23A to 23C. As a product of the crystal unit with temperature sensor 1A to which the IC chip package 3 is bonded, the IC chip package 3 has sizes of 1.6 mm in the longer side direction and 1.2 mm in the shorter side direction.

Notches 5 (castellations) are disposed at four corners of the IC chip package 3, which constitutes the crystal unit with temperature sensor 1A, in the thickness direction. The notch 5 includes a connecting electrode 51. The connecting electrode 51 electrically connects a mounting terminal 37 to a wiring, which is extracted from an IC chip of the IC chip package 3 to a sidewall.

The crystal unit with temperature sensor 1A includes the crystal package 2 and the IC chip package 3, which are bonded in two levels in the vertical direction with a thermoset resin 4 with solder particles, thus forming an integrated electronic component. The crystal package 2 may employ any of crystal packages illustrated in FIGS. 1 to 5. Here, the crystal package 2 in FIG. 5A is employed. As a temperature sensor, for example, a diode is applicable as well as a thermistor.

FIG. 33 is a view illustrating the bottom surface (the outer surface, the mounting surface of an applied equipment) of the crystal unit with temperature sensor 1A in FIGS. 32A to 32C. Four surface mount type mounting terminals 37 are disposed on the bottom surface. As illustrated in FIG. 33, these terminals function as an output terminal (Xtal OUT) of the crystal unit with temperature sensor 1A, an output terminal (S/D OUT) of a thermistor or a diode, an input terminal (Xtal IN) of the crystal unit 1A with temperature sensor, and an input terminal (S/D IN) of the thermistor or the diode.

FIGS. 34A to 34C are explanatory views of a mounting portion of the thermistor or the diode of the IC chip package of the crystal unit with temperature sensor 1A illustrated in FIGS. 32A to 32C. FIG. 34A illustrates a plan view viewed from a crystal package side. FIG. 34B is a cross-sectional view taken along the line XXXIVB-XXXIVB of FIG. 34A and an exemplary mounting of a thermistor 7 on a second depressed portion 38. FIG. 34C is an exemplary mounting of a diode 17 on the second depressed portion 38. The thermistor 7 or the diode 17 uses its temperature characteristic and is connected to an electrode pad 35 disposed at a wiring pattern on the inner bottom of the second depressed portion 38 of the IC chip package 3 for mounting.

Next, another exemplary fabrication method of a piezoelectric module according to this disclosure will be described with the crystal controlled oscillator of FIGS. 23A to 23C using the crystal package illustrated in FIG. 5A as one embodiment (Embodiment 18). A crystal controlled oscillator using a crystal package and an IC chip package of another type may also be fabricated by a similar process.

Embodiment 18

FIG. 35 is a cross-sectional view of the main part of the crystal controlled oscillator including notches at four corners illustrated in FIGS. 23A to 23C. The crystal controlled oscillator is a target of another exemplary fabrication method of this disclosure. This crystal controlled oscillator 1 includes a depressed portion 38 (a second depressed portion) of an IC chip package 3 that houses an IC chip 33. A thermoset resin 4 with solder particles is applied on the whole circumference of the opening end surface of the second depressed portion 38. Thus, the IC chip package 3 and the crystal package 2 are integrated by bonding such that the opening is covered with the bottom surface of the crystal package 2.

FIGS. 36A to 36D are fabrication process views of the main part of the crystal controlled oscillator illustrating one exemplary fabrication method of the crystal controlled oscillator according to this disclosure. In this fabrication method, the crystal controlled oscillator of a predetermined structure is fabricated by performing steps described below with following the arrows in FIGS. 36A to 36D. The following describes each step. Each component member in FIGS. 36A to 36D can be understood with referring to each above-described embodiment.

Step A: A large number of IC chip packages 3 are prepared. Each of FIGS. 36A to 36D illustrate only two packages. Before the individual crystal packages are bonded, the respective IC chip packages 3 are separated into individual pieces. The bottom wall layer of the IC chip packages 3 is constituted of two laminated ceramics sheets. A metal film 12, which functions as a shielding, is formed on the inner layer to cover a housing region of the IC chip 33. The second depressed portion 38, which is formed by a frame wall layer, houses the IC chip 33. A connecting terminal 36 is formed on the opening end surface (a top surface of a sidewall layer that constitutes the second depressed portion 38) of the second depressed portion 38.

Step B: A layer of the thermoset resin 4 with solder particles is formed on the opening end surface (the top surface of the sidewall layer that constitutes the second depressed portion 38) of the second depressed portion 38. The thermoset resin 4 with solder particles is formed on the whole circumference of the opening end surface including the connecting terminal 36 (the arrow C). To form the thermoset resin 4 with solder particles, a known pattern formation method with minute slurry, such as a dispenser application, screen-printing, and inkjet coating, is applicable.

Step C: Individual piece of the crystal package 2 is placed at each opening end surface of the individual second depressed portion 38 where the thermoset resin 4 with solder particles layer is formed. In this state, a pressurization (the arrow P) and a heating (the arrow H) processes are performed to the individual crystal package piece and the IC chip package 3. At this time, solder particles of the thermoset resin 4 with solder particles melt, spread, and wet the external terminal 27 of the individual crystal package piece and the connecting terminal 36 disposed at the IC chip package 3. Accordingly, the thermoset resin of the thermoset resin 4 with solder particles also melts. The melted resin fills in between a whole circumference of the opening end surface including the connecting terminals 36, which faces the individual crystal package piece and disposed on the individual IC chip package, and the external terminal 27 of the individual IC chip package.

Step D: The melted solder particles sufficiently spread and wet between the external terminal 27 of the individual crystal package piece and the connecting terminal 36 of the IC chip package 3. After elapse of predetermined time taken for the melted resin to sufficiently fill in between the opening end surface and the individual crystal package piece, the heating process is halted to remove heat. Then, the melted solder is solidified and bonds the external terminal of the crystal package 2 to the connecting terminal of the IC chip package 3 by metal bonding. The thermoset resin hardens between the opening end surface of the IC chip package 3 and the crystal package 2. The crystal package electrically connects to and mechanically and strongly bonds to the IC chip package 3.

The crystal controlled oscillator 1 illustrated in FIG. 35 is fabricated in the above-described steps.

An anisotropic conductive layer may substitute for the thermoset resin with solder particles. The effect differs in a connection formation between the external terminal and the connecting terminal, but is otherwise similar to bonding using the thermoset resin with solder particles. As described above, in the case where the container main body of the crystal package is made of a glass material, a crystal controlled oscillator may be constituted with a bonding structure similarly to this embodiment.

This disclosure is not limited to a piezoelectric module such as a crystal controlled oscillator, but is similarly applicable to bonding of two or more device component members where an electrical connection and strong and mechanical bonding without a gap is required.

It is an object of this disclosure to provide the following piezoelectric module typified by a crystal controlled oscillator. The piezoelectric module ensures a large second depressed portion where a circuit component such as an IC chip is to be mounted. The piezoelectric module has a structure where a connecting terminal of a mounting board is strongly bonded to an external terminal of a piezoelectric resonator typified by a crystal unit. The piezoelectric module can mount a large size IC chip or similar member without enlarging the external size. The piezoelectric module has a structure with strong bonding and ensures a sealing structure where the crystal package is securely, electrically, and mechanically connected by a simple fabrication process on an opening end surface of a depressed portion of an IC chip package, which includes a connecting terminal to be connected to an external terminal of a crystal unit. It is apparent that this disclosure is not limited to a crystal controlled oscillator, but is applicable to a general bonding structure with the following piezoelectric modules: a piezoelectric module that includes a piezoelectric oscillator using a piezoelectric material including a crystal, and a piezoelectric module that includes a circuit component package that includes a part of a circuit component of an oscillator. Hereinafter, these piezoelectric modules are sometimes referred to as a piezoelectric oscillator or similar.

An exemplary crystal controlled oscillator for describing a piezoelectric module according to this disclosure includes a crystal package and a circuit component package (an IC chip package in the case where a circuit component is an IC chip). The crystal package includes an insulating container that houses a crystal unit and includes external terminals. The circuit component package includes a circuit component such as an IC chip and a container with connecting terminals for connecting to the external terminals. The IC chip integrates circuits for constituting the crystal controlled oscillator together with a crystal unit. To electrically, mechanically, and strongly connect the crystal package and the circuit component package together, the following typical constitution is employed. By replacing the following "crystal" with "piezoelectricity", "piezoelectric module" is deduced from "crystal controlled oscillator".

(1) A crystal controlled oscillator includes a crystal package and a circuit component package. The crystal package houses a crystal unit. The circuit component package houses a circuit component configured to generate an oscillation signal at a predetermined frequency based on a vibration signal of the crystal unit. The crystal package and the circuit component package are electrically and mechanically bonded. The crystal package includes a first depressed portion, a lid body, and a plurality of external terminals. The first depressed portion is formed by a first bottom wall layer and a first frame wall layer. The first depressed portion houses the crystal unit. The lid body seals the first depressed portion. The plurality of external terminals is configured to output the vibration signal of the crystal unit to an outer bottom surface of the first depressed portion. The circuit component package includes a second depressed portion and a plurality of connecting terminals. The second depressed portion is formed by a second bottom wall layer and a second frame wall layer. The second depressed portion houses the circuit component. The plurality of connecting terminals is disposed on an opening end surface of the second depressed portion. The plurality of connecting terminals is electrically connected to the plurality of respective external terminals on the outer bottom surface of the crystal package. The crystal controlled oscillator includes a thermoset resin with solder particles interposed between a whole circumference of the opening end surface of the second depressed portion and the outer bottom surface of the first depressed portion of the crystal package, and the second depressed portion includes the plurality of connecting terminals of the circuit component package. The plurality of external terminals of the crystal package and the plurality of connecting terminals of the circuit component package are electrically connected by a metal bonding. The metal bonding employs melting and hardening of solder particles that constitute the thermoset resin with solder particles. The whole circumference of the opening end surface of the second depressed portion of the circuit component package and the outer bottom surface of the first depressed portion of the crystal package are bonded by melting and hardening of the thermoset resin that constitutes the thermoset resin with solder particles.

(2) According to the description (1), the first bottom wall layer and the first frame wall layer that constitute the first depressed portion of the crystal package are made of a ceramics sheet. The second bottom wall layer and the second frame wall layer that constitute the second depressed portion of the circuit component package are made of a ceramics sheet.

(3) According to the description (1), the first bottom wall layer, the first frame wall layer, and the lid body that constitute the first depressed portion of the crystal package are made of a crystal plate. The second bottom wall layer and the second frame wall layer that constitute the second depressed portion of the circuit component package are made of a ceramics sheet.

(4) According to the description (3), a rough surface treatment is performed on the outer bottom surface of the first bottom wall layer where at least a whole circumference of an opening end surface side of the second depressed portion of the circuit component package. The melted solder particles and the melted thermoset resin are strongly bonded on the outer bottom surface of the first bottom wall layer of the crystal package.

(5) According to the description (4), the rough surface treatment forms either or both of a large number of unevenness and a large number of micropores that are strongly bonded by anchoring in a state where the melted solder particles and the melted thermoset resin are received and harden on the outer bottom surface of the first bottom wall layer of the crystal package.

(6) According to the description (1), a thermoset resin with solder particles for bonding the crystal package and the IC chip package extends inside from the external terminal formed on the outer bottom surface of the crystal package along the outer bottom surface. The outer bottom surface is disposed to cover the opening of the depressed portion of the IC chip package.

(7) According to the description (1), a thermoset resin with solder particles for bonding the crystal unit and the IC chip package is filled from a side surface of the IC chip including a part of a top surface to a part of an inner bottom surface of the IC chip package mounting the IC chip.

(8) A crystal controlled oscillator includes a crystal package and a circuit component package. The crystal package houses a crystal unit. The circuit component package houses a circuit component configured to generate an oscillation signal at a predetermined frequency based on a vibration signal of the crystal unit. The crystal package and the circuit component package are electrically and mechanically bonded. The crystal package includes a first depressed portion, a lid body, and a plurality of external terminals. The first depressed portion is formed by a first bottom wall layer and a first frame wall layer. The first depressed portion houses the crystal unit. The lid body seals the first depressed portion. The plurality of external terminals is configured to output the vibration signal of the crystal unit to an outer bottom surface of the first depressed portion. The circuit component package includes a second depressed portion and a plurality of connecting terminals. The second depressed portion is formed by a second bottom wall layer and a second frame wall layer. The second depressed portion houses the circuit component. The plurality of connecting terminals is disposed on an opening end surface of the second depressed portion. The plurality of connecting terminals is electrically connected to the plurality of respective external terminals on the outer bottom surface of the crystal package. The crystal controlled oscillator includes an anisotropic conductive layer interposed between a whole circumference of the opening end surface of the second depressed portion and the outer bottom surface of the first depressed portion of the crystal package, and the second depressed portion includes the plurality of connecting terminals of the circuit component package. The plurality of external terminals of the crystal package and the plurality of connecting terminals of the circuit component package are electrically connected by a bridging bonding. The bridging bonding forms a bridge by interposing a conductive filler constituting the anisotropic conductive layer by pressurization and heating at fabrication. The whole circumference of the opening end surface of the second depressed portion of the circuit component package and the outer bottom surface of the first depressed portion of the crystal package are bonded by melting and hardening of a thermoset resin that constitutes the anisotropic conductive layer.

(9) According to the description (8), the first bottom wall layer and the first frame wall layer that constitute the first depressed portion of the crystal package are made of a ceramics sheet. The second bottom wall layer and the second frame wall layer that constitute the second depressed portion of the circuit component package are made of a ceramics sheet.

(10) According to the description (8), the first bottom wall layer, the first frame wall layer, and the lid body that constitute the first depressed portion of the crystal package are made of a crystal plate. The second bottom wall layer and the second frame wall layer that constitute the second depressed portion of the circuit component package are made of a ceramics sheet.

(11) According to the description (10), a rough surface treatment is performed on the opening end surface contacts an outer bottom surface of the first bottom wall layer where at least a whole circumference of the opening end surface of the second depressed portion of the circuit component package faces. The melted conductive filler and the melted thermoset resin are strongly bonded on the outer bottom surface of the first bottom wall layer of the crystal package.

(12) According to the description (11), the rough surface treatment forms either or both of a large number of unevenness and a large number of micropores that are strongly bonded by anchoring in a state where the melted thermoset resin is received and hardens on the outer bottom surface of the first bottom wall layer of the crystal package.

(13) According to any of the descriptions (8) to (12), the anisotropic conductive layer for bonding the crystal package and the IC chip package extends inside from the external terminal formed on the outer bottom surface of the crystal package along the outer bottom surface. The outer bottom surface is disposed to cover the opening of the depressed portion of the IC chip package.

(14) According to any of the descriptions (8) to (12), the anisotropic conductive layer for bonding the crystal package and the IC chip package is filled from a side surface of the IC chip including a part of a top surface to a part of an inner bottom surface of the IC chip package where the IC chip is mounted.

The following further describes detailed structures of this disclosure.

(15) A crystal package houses a crystal unit in a depressed portion of a container main body formed of a bottom wall layer and a frame wall layer. The bottom wall layer and the frame wall layer are made of an insulating material such as a ceramics sheet, a crystal plate, and a glass. The depressed portion is sealed by a lid body made of an insulating material such as a metal, a crystal plate, and a glass. The bottom wall layer has an outer bottom surface where an external terminal that electrically connects to an IC chip package described later is disposed. The external terminal connects to an excitation electrode of the crystal unit.

(16) Similarly, the IC chip package houses an IC chip in the depressed portion of a container formed of the bottom wall layer and the frame wall layer. The bottom wall layer and the frame wall layer are made of an insulating material such as a ceramics sheet, a crystal plate, and a glass. The width (the width in planar view viewed in the bottom wall layer direction) of the frame wall layer that forms the depressed portion is fabricated to be small (narrow) so as to form an area in the depressed portion larger than that of the conventional example illustrated in FIGS. 37A and 37B. This allows mounting an IC chip and an electronic component in larger size without enlarging the external size.

(17) The IC chip package includes the opening end surface (the surface of the frame wall layer) of the depressed portion in the container formed of the bottom wall layer and the frame wall layer. The opening end surface includes a connecting terminal that faces and electrically connects to the external terminal of the crystal package. The connecting terminal connects to a circuit of the IC chip. The bottom wall layer forms a mounting terminal on the outer bottom surface. The mounting terminal is for surface mounting on a substrate or similar of the mounting target equipment. An operating power source is supplied from these terminals, and an oscillation signal is supplied to a required functional circuit of a mounting board.

(18) The crystal package and the IC chip package are connected together by the following method. A thermoset resin with solder particles is interposed on the whole circumference between the formation surface of the external terminal and the formation surface of the connecting terminal, and then is heated and pressurized. Alternatively, an anisotropic conductive layer where conductive material particles are dispersed in a thermoset resin is formed, and then is heated and pressurized.

(19) In the case where a thermoset resin with solder particles is used, the thermoset resin with solder particles is applied by surrounding around all surfaces that face the outer bottom surface of the crystal package. The all surfaces are on the opening end surface of the depressed portion of the IC chip package and include the connecting terminal. Heating and pressurizing the thermoset resin with solder particles electrically connects the above-described external terminal and the connecting terminal together by metal bonding. Additionally, the crystal package is mechanically and fixedly secured to the IC chip package strongly without a gap by bonding by a melting and hardening of the thermoset resin. The thermoset resin with solder particles may be applied at the outer bottom surface side of the crystal package or may be applied on both of the opening end surface of the depressed portion of the IC chip package and the outer bottom surface of the crystal package.

(20) In the case where an anisotropic conductive layer is used, the anisotropic conductive layer is formed on the whole circumference including the formation surface of the external terminal and the formation surface of the connecting terminal. Between the crystal package and the IC chip package is pressurized and heated, and a conductive filler electrically forms a bridge between the connecting terminal and the external terminal to connect them. The crystal package includes the outer bottom surface of the first bottom wall layer constituting the container main body. The IC chip package includes the opening end surface of the second depressed portion. Between the outer bottom surface and the opening end surface is sealed by hardening and bonding of the thermoset resin and then the both are mechanically secured. Particles of gold-coated resin or similar material are applicable to a conductive filler.

(21) The connecting terminal of the IC chip package needs only to receive a voltage signal from the crystal package. Accordingly, its electrode area needs not to be large. The connecting terminal of the IC chip package may only need an area that has enough size to securely connect the external terminal of the crystal package. The connecting terminal may have any shape insofar as the connecting terminal, which is disposed on the opening end surface of the depressed portion of the IC chip package, faces the external terminal of the above-described crystal package and has an area enough to engage solder particles in a thermoset resin with solder particles and perform metal bonding. It is true of the case where an anisotropic conductive layer is employed.

(22) The crystal package includes a container main body with a bottom wall layer on which an external terminal is formed. The bottom wall layer is flat on all surfaces. The external terminal may become an electrode with large area where the external terminal 27 is spaced at the maximum distance such that short-circuit does not occur each other. On the other hand, the connecting terminal of the IC chip package may be relatively small compared with the external terminal (generally, a square or a rectangular shape close to a square) of the crystal package. A smaller connecting terminal enables downsizing the opening end surface of the depressed portion of the IC chip package, resulting in an enlargement of the depressed portion area. This allows forming the thermoset resin with solder particles or the anisotropic conductive layer over the whole circumference of the bonding portion, which includes peripherals of electrode portions of the both packages, seamlessly. This ensures secure sealing and strong bonding of the both packages.

(23) The IC chip can be mounted on the depressed portion formed of the bottom wall layer and the frame wall layer made of a material such as a ceramics sheet by a method that is any of so-called flip chip bonding, wire bonding, solder bump bonding, and bonding using a thermoset resin with solder particles.

(24) The thermoset resin with solder particles or the anisotropic conductive layer, which bonds the crystal package and the IC chip package together, is disposed such that the opening of the depressed portion of the IC chip package is covered. The thermoset resin with solder particles or the anisotropic conductive layer extends inside from the external terminal, which is formed on the outer bottom surface of the crystal package, along the outer bottom surface. This further enhances bonding of the both packages. Additionally, the thermoset resin with solder particles is filled from the side surface of the IC chip including a part of the top surface (the back surface of the chip: the opening side of the depressed portion) to a part of the inner bottom surface of the IC chip package with the IC chip. This increases rigidity of the IC chip package, further enhancing bonding of the both packages.

(25) Instead of a structure where a crystal package is stacked and fixedly secured to the IC chip package with an IC chip, a structure of a crystal unit with temperature sensor, which houses a thermistor or a diode, is similarly applicable. In this case, an IC chip is not mounted to the IC chip package. However, in this disclosure, the IC chip is one of an electronic component similar to a thermistor or a diode. For convenience of explanation, a package that houses a discrete circuit component, such as a thermistor or a diode including an IC chip, is collectively referred to as a circuit component package.

(26) If a container main body is made of a crystal plate, including a lid body of the crystal package, the bottom wall layer of the container main body is also made of a quartz-crystal material. Hence, bonding strength with a thermoset resin is low, compared with bonding strength using a ceramics material. According to this disclosure, a large number of minute unevenness and micropores are formed on a surface (an outer surface) of the bottom wall layer of the container main body made of a crystal plate. Then, a part of a melted resin gets through the minute unevenness and micropores and anchors, enhancing bonding with the IC chip package. The container main body including the lid body of the crystal package may be made of a glass material. Bonding strength of such container main body may be enhanced by performing surface treatment similar to the above-described surface treatment on the outer wall layer made of a crystal plate.

(27) The bottom wall layers that constitute one or both of the crystal package and the IC chip package may be a plurality of layers. A metal film is disposed at the inner layer and is connected to the ground. This provides an electromagnetic shielding. A metal film or a metal layer may be disposed at a portion that avoids the external terminal or the connecting terminal on the bottom wall layers that constitute one or both of the crystal package and the IC chip package. In the case where the lid body of the crystal package is formed by an insulator other than a metal plate, a metal film or a metal layer may be disposed on the inner surface or the outer surface of the package and connected to the ground.

Thus, even when the connecting terminal of the IC chip package is relatively smaller than the external terminal of the crystal package, connection of the both by bonding using the thermoset resin with solder particles or an anisotropic conductive layer ensures supplying a vibration signal voltage of the crystal unit mounted to the crystal package with an oscillator circuit including an IC chip. Alternatively, the thermoset resin with solder particles or the anisotropic conductive layer is formed over the whole circumference of the bonding portion of the crystal package and the IC chip package which is a portion where the crystal package and the IC chip package are bonded together. Then, the external terminal of the crystal package and the connecting terminal of the IC chip package are heated and pressurized to perform metal bonding or a conductively bond using a metal-coated layer between conductive particles. At the same time, the both packages are mechanically and strongly bonded by hardening of the thermoset resin with solder particles or the thermoset resin with conductive particles, thus hermetically sealing the depressed portion of the IC chip package.

The crystal package and the IC chip package are sealed with the thermoset resin with solder particles or the anisotropic conductive layer. This prevents adhesion of a foreign matter and intrusion of humidity to the IC chip and eliminates the need for filling an underfill material to fixedly secure the IC chip. To further strongly secure the IC chip, the thermoset resin with solder particles is excessively applied to the extent that the thermoset resin with solder particles overflows within the depressed portion of the IC chip package. This further enhances the bonding.

The connecting terminal, which is disposed on the opening end surface of the depressed portion of the IC chip package for electrically connecting to the external terminal of the crystal package, is downsized. Accordingly, the thickness of the frame wall layer of the IC chip package may be thin. As a result, the area of the depressed portion can be enlarged, thus allowing housing and mounting an IC chip in a large size. Especially, a high-performance oscillator, such as Temperature compensated crystal controlled oscillator (TCXO), includes a large-scale circuit to be integrated into the IC chip, compared with a circuit of a crystal controlled oscillator without a temperature control function (SPXO). Therefore, a high performance and large-scale IC chip can be housed and mounted without enlarging the external size of the IC chip package. In the case where an IC chip in the same size as the conventional IC chip is used, the external sizes of the IC chip package and the crystal package are downsized. This leads to downsizing of the external size of the whole crystal controlled oscillator.

In the case where a thermoset resin with solder particles is used, a solder precoating, which is conventionally performed on electrode surfaces of an external terminal of the crystal package and a connecting terminal of an IC chip package using a solder to connect the terminals, is unnecessary, thus simplifying a fabrication process. In this case, the electrical connection between the external terminal and the connecting terminal and bonding between the crystal package and the IC chip package can be performed at the same time. This also simplifies a fabrication process.

In the case where the container main body of the crystal package is made of a quartz-crystal material or a glass material and the crystal package is bonded to the IC chip package with the thermoset resin with solder particles or the anisotropic conductive layer, a rough surface treatment is performed on the outer bottom surface of the crystal package or a large number of minute unevenness is formed. Thus, a bonding strength can be improved by an anchor effect of the resin to be melted and hardened.

It will be obvious that various modifications are possible without departing from the technical scope of the appended claims. This disclosure can be embodied and practiced in other different forms without departing from the spirit and essential characteristics of the present invention.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A piezoelectric module, comprising:
a piezoelectric package that houses a piezoelectric resonator; and
a circuit component package that houses a circuit component configured to generate an oscillation signal at a predetermined frequency based on a vibration signal of the piezoelectric resonator, and the piezoelectric package and the circuit component package are electrically and mechanically bonded, wherein
the piezoelectric package comprises:
a first depressed portion that is formed by a first bottom wall layer and a first frame wall layer, the first depressed portion housing the piezoelectric resonator;
a lid body that seals the first depressed portion; and
a plurality of external terminals configured to output the vibration signal of the piezoelectric resonator to an outer bottom surface of the first depressed portion;
the circuit component package comprises:
a second depressed portion that is formed by a second bottom wall layer and a second frame wall layer, the second depressed portion housing the circuit component; and
a plurality of connecting terminals disposed on an opening end surface of the second depressed portion, the plurality of connecting terminals being electrically connected to the plurality of respective external terminals on the outer bottom surface of the piezoelectric package;
the piezoelectric module comprises a thermoset resin with solder particles interposed between a whole circumference of the opening end surface of the second depressed portion and the outer bottom surface of the first depressed portion of the piezoelectric package, and the second depressed portion including the plurality of connecting terminals of the circuit component package;
the plurality of external terminals of the piezoelectric package and the plurality of connecting terminals of the circuit component package are electrically connected by a metal bonding,
the metal bonding employs melting and hardening of solder particles that constitute the thermoset resin with solder particles, and
the whole circumference of the opening end surface of the second depressed portion of the circuit component package and the outer bottom surface of the first depressed portion of the piezoelectric package are bonded by melting and hardening of the thermoset resin that constitutes the thermoset resin with solder particles.

2. The piezoelectric module according to claim 1, wherein
the first bottom wall layer and the first frame wall layer that constitute the first depressed portion of the piezoelectric package are made of a ceramics sheet, and
the second bottom wall layer and the second frame wall layer that constitute the second depressed portion of the circuit component package are made of a ceramics sheet.

3. The piezoelectric module according to claim 1, wherein
the first bottom wall layer, the first frame wall layer, and the lid body that constitute the first depressed portion of the piezoelectric package are made of a crystal plate.

4. The piezoelectric module according to claim 3, wherein
a rough surface treatment is performed on the outer bottom surface of the first bottom wall layer where at least a whole circumference of an opening end surface of the second depressed portion of the circuit component package, and
the melted solder particles and the melted thermoset resin are strongly bonded on the outer bottom surface of the first bottom wall layer of the piezoelectric package.

5. The piezoelectric module according to claim 4, wherein
the rough surface treatment performed surface has a plurality of minute unevenness that is strongly bonded by anchoring in a state where the melted solder particles and the melted thermoset resin are received and harden on the outer bottom surface of the first bottom wall layer of the piezoelectric package.

6. The piezoelectric module according to claim 1, wherein
the thermoset resin with solder particles for bonding the piezoelectric resonator and the circuit component package extends inside from the external terminal formed on the outer bottom surface of the piezoelectric resonator along the outer bottom surface, and
the outer bottom surface is disposed to cover the opening of the depressed portion of the circuit component package.

7. The piezoelectric module according to claim 1, wherein
the thermoset resin with solder particles for bonding the piezoelectric resonator and the circuit component package is filled from a side surface of the circuit component including a part of a top surface to a part of an inner bottom surface of the circuit component package housing the circuit component.

8. A piezoelectric module comprising:
a piezoelectric package that houses a piezoelectric resonator; and
a circuit component package that houses a circuit component configured to generate an oscillation signal at a predetermined frequency based on a vibration signal of the piezoelectric resonator, and the piezoelectric package and the circuit component package are electrically and mechanically bonded, wherein
the piezoelectric package comprises:
a first depressed portion that is formed by a first bottom wall layer and a first frame wall layer, the first depressed portion housing the piezoelectric resonator;
a lid body that seals the first depressed portion; and
a plurality of external terminals configured to output the vibration signal of the piezoelectric resonator to an outer bottom surface of the first depressed portion;

the circuit component package comprises:
- a second depressed portion that is formed by a second bottom wall layer and a second frame wall layer, the second depressed portion housing the circuit component; and
- a plurality of connecting terminals disposed on an opening end surface of the second depressed portion, the plurality of connecting terminals being electrically connected to the plurality of respective external terminals on the outer bottom surface of the piezoelectric package;
- the piezoelectric module comprises an anisotropic conductive layer interposed between a whole circumference of the opening end surface of the second depressed portion and the outer bottom surface of the first depressed portion of the piezoelectric package, and the second depressed portion including the plurality of connecting terminals of the circuit component package;
- the plurality of external terminals of the piezoelectric package and the plurality of connecting terminals of the circuit component package are electrically connected by a bridging bonding,
- the bridging bonding forms a bridge by interposing a conductive filler constituting the anisotropic conductive layer by pressurization and heating at fabrication, and
- the whole circumference of the opening end surface of the second depressed portion of the circuit component package and the outer bottom surface of the first depressed portion of the piezoelectric package are bonded by melting and hardening of a thermoset resin that constitutes the anisotropic conductive layer.

9. The piezoelectric module according to claim 8, wherein the first bottom wall layer and the first frame wall layer that constitute the first depressed portion of the piezoelectric package are made of a ceramics sheet, and
the second bottom wall layer and the second frame wall layer that constitute the second depressed portion of the circuit component package are made of a ceramics sheet.

10. The piezoelectric module according to claim 8, wherein
the first bottom wall layer, the first frame wall layer, and the lid body that constitute the first depressed portion of the piezoelectric package are made of a crystal plate, and
the second bottom wall layer and the second frame wall layer that constitute the second depressed portion of the circuit component package are made of a ceramics sheet.

11. The piezoelectric module according to claim 10, wherein
a rough surface treatment is performed on the outer bottom surface of the first bottom wall layer where at least a whole circumference of an opening end surface of the second depressed portion of the circuit component package, and
the melted conductive filler and the melted thermoset resin are strongly bonded on the outer bottom surface of the first bottom wall layer of the piezoelectric package.

12. The piezoelectric module according to claim 11, wherein
the rough surface treatment performed surface has a plurality of minute unevenness that is strongly bonded by anchoring in a state where the melted thermoset resin is received and harden on the outer bottom surface of the first bottom wall layer of the piezoelectric package.

13. The piezoelectric module according to claim 8, wherein
the anisotropic conductive layer for bonding the piezoelectric resonator and the circuit component package extends inside from the external terminal formed on the outer bottom surface of the piezoelectric resonator along the outer bottom surface, and
the outer bottom surface is disposed to cover the opening of the depressed portion of the circuit component package.

14. The piezoelectric module according to claim 8, wherein
the anisotropic conductive layer for bonding the piezoelectric package and the circuit component package is filled from a side surface of the circuit component including a part of a top surface to a part of an inner bottom surface of the circuit component package housing the circuit component.

15. The piezoelectric module according to claim 1, further comprising:
- at least one notch, the notch is disposed at one of four corners of the circuit component package;
- a lead line on the circuit component package for the circuit component mounted in the circuit component package;
- a mounting electrode disposed on the bottom surface of the circuit component package; and
- a connecting electrode formed in the notch that electrically connects the mounting electrode to the lead line.

* * * * *